(12) United States Patent
Arikan

(10) Patent No.: US 11,677,500 B2
(45) Date of Patent: Jun. 13, 2023

(54) METHODS AND APPARATUS FOR ENCODING AND DECODING OF DATA USING CONCATENATED POLARIZATION ADJUSTED CONVOLUTIONAL CODES

(71) Applicant: Polaran Haberlesme Teknolojileri Anonim Sirketi, Ankara (TR)

(72) Inventor: Erdal Arikan, Ankara (TR)

(73) Assignee: Polaran Haberlesme Teknolojileri Anonim Sirketi, Cankaya (TR)

( * ) Notice: Subject to any disclaimer, the term of this patent is extended or adjusted under 35 U.S.C. 154(b) by 21 days.

(21) Appl. No.: 17/039,911

(22) Filed: Sep. 30, 2020

(65) Prior Publication Data

US 2022/0103291 A1    Mar. 31, 2022

(51) Int. Cl.
*H03M 13/29* (2006.01)
*H04L 1/00* (2006.01)
(Continued)

(52) U.S. Cl.
CPC .......... *H04L 1/0064* (2013.01); *H03M 13/05* (2013.01); *H03M 13/23* (2013.01);
(Continued)

(58) Field of Classification Search
CPC ..... H04L 1/0045; H04L 1/0061; H04L 1/201; H04L 69/22; H04L 63/02; H04L 1/0064;
(Continued)

(56) References Cited

U.S. PATENT DOCUMENTS 6,339,684 B1 * 1/2002 Sato .................. G03G 15/0863
399/25
9,362,956 B2    6/2016 Mahdavifar
(Continued)

FOREIGN PATENT DOCUMENTS

DE    10 2017 110 389 A1    11/2017
WO    WO-2020122749 A1 *  6/2020  ............ H03M 13/13

OTHER PUBLICATIONS

E. Arikan, "Channel polarization: A method for constructing capacity-achieving codes for symmetric binary-input memoryless channels", IEEE Transactions on Information Theory, vol. 55, No. 7, pp. 3051-3073, Jul. 2009.
(Continued)

*Primary Examiner* — Albert Decady
*Assistant Examiner* — Enam Ahmed

(57) ABSTRACT

An encoder receives a concatenated encoder input block d, splits d into an outer code input array a, and encodes a using outer codes to generate an outer code output array b. The encoder generates, from b, a concatenated code output array x using a layered polarization adjusted convolutional (LPAC) code. A decoder counts layers and carries out an inner decoding operation for a layered polarization adjusted convolutional (LPAC) code to generate an inner decoder decision $\tilde{b}_i$ from a concatenated decoder input array y and a cumulative decision feedback ($\hat{b}_1, \hat{b}_2, \ldots, \hat{b}_{i-1}$). The decoder carries out an outer decoding operation to generate from $\tilde{b}_i$ an outer decoder decision $\hat{a}_i$, and carries out a reencoding operation to generate a decision feedback $\hat{b}_i$ from $\hat{a}_i$, where the number of layers is an integer greater than one, with a concatenated decoder output block $\hat{d}$ being generated from outer decoder decisions.

12 Claims, 6 Drawing Sheets

(51) Int. Cl.
*H03M 13/05* (2006.01)
*H03M 13/23* (2006.01)
*H03M 13/25* (2006.01)

(52) U.S. Cl.
CPC ....... *H03M 13/251* (2013.01); *H03M 13/253* (2013.01); *H03M 13/2939* (2013.01); *H04L 1/0057* (2013.01); *H04L 1/0059* (2013.01)

(58) Field of Classification Search
CPC .... H04L 1/0057; H04L 1/0059; H03M 13/05; H03M 13/23; H03M 13/251; H03M 13/253; H03M 13/2939; H03M 13/13; H03M 13/2936; H03M 13/3776; H03M 13/1515
USPC ......................................................... 714/776
See application file for complete search history.

(56) References Cited

U.S. PATENT DOCUMENTS

| | | | | |
|---|---|---|---|---|
| 9,612,796 | B2* | 4/2017 | Uhl | G06F 7/4876 |
| 10,230,403 | B2 | 3/2019 | Freudenberger et al. | |
| 2004/0073945 | A1* | 4/2004 | Yuzawa | H04N 7/012 725/50 |
| 2016/0352362 | A1* | 12/2016 | Fonseka | H03M 13/036 |
| 2016/0380763 | A1* | 12/2016 | Ahn | H04L 9/0875 380/270 |
| 2018/0167369 | A1* | 6/2018 | Shapira | H04B 7/0617 |
| 2019/0058490 | A1* | 2/2019 | Klein | H03M 13/13 |
| 2019/0312676 | A1* | 10/2019 | Jeong | H03M 13/6356 |
| 2020/0259510 | A1* | 8/2020 | Meller | H03M 13/13 |
| 2020/0343909 | A1* | 10/2020 | Chen | H03M 13/2906 |
| 2021/0159916 | A1* | 5/2021 | Maunder | H03M 13/6502 |
| 2021/0297094 | A1* | 9/2021 | Hamelin | H04L 1/0052 |

OTHER PUBLICATIONS

E. Arikan, U.S. Appl. No. 16/453,887, entitled "Methods and Apparatus for Error Correction Coding with Triangular Factorization of Generator Matrices", filed Jun. 26, 2019, 89 pgs.

E. Arikan, "From sequential decoding to channel polarization and back again", arXiv:1908.09594 [cs, math], Aug. 26, 2019, 10 pgs.
Arikan, E., & Markarian, G. (Jul. 13, 2009), "Two-dimensional polar coding", Proc. Tenth International Symposium on Coding Theory and Applications (ISCTA'09), Ambleside, UK, 3 pgs.
Elias, Pete, (1954), "Error-free Coding", Transactions of the IRE Professional Group on Information Theory, 4(4), pp. 29-37.
Falconer, D. D. (1969), "A hybrid coding scheme for discrete memoryless channels", The Bell System Technical Journal, 48(3), pp. 691-728.
Fano, Robert M. (1963), "A heuristic discussion of probabilistic decoding", IEEE Transactions on Information Theory, 9(2), pp. 64-74.
Forney Jr, G. David (1965), "Concatenated Codes" (Technical Report No. 440), Massachusetts Institute of Technology, 116 pgs.
Jacobs, I., & Berlekamp, E. (1967), "A lower bound to the distribution of computation for sequential decoding" IEEE Transactions on Information Theory, 13(2), pp. 167-174.
Zabinski, P. J., Gilbert, B. K., & Daniel, E. S. (2013), "Coming Challenges with Terabit-per-Second Data Communication" IEEE Circuits and Systems Magazine, 13(3), pp. 10-20.
Zyablov, V., Shavgulidze, S., & Bossert, M. (1999), "An Introduction to Generalized Concatenated Codes" European Transactions on Telecommunications, 10(6), pp. 609-622.
Saber et al., "Design of Generalized Concatenated Codes Based on Polar Codes With Very Short Outer Codes", IEEE Transactions on Vehicular Technology, vol. 66, No. 4, Apr. 2017, 13 pages.
Li et al., "Concatenations of Polar Codes with Outer Nonbinary LDPC Codes", 2017 17th IEEE International Conference on Communication Technology, Oct. 27, 2017, 5 pages.
Rowshan et al., "Polarization-adjusted Convolutional (PAC) Codes: Fano Decoding vs List Decoding", Feb. 17, 2020, 13 pages.
Yao et al., "List Decoding of Arikan's PAC Codes", May 27, 2020, 9 pages.
International Search Report and Written Opinion of the International Searching Authority dated Dec. 8, 2021 in connection with International Patent Application No. PCT/IB2021/058868, 15 pages.
Written Opinion of the International Searching Authority dated Sep. 29, 2022 in connection with International Patent Application No. PCT/IB2021/058868, 4 pages.

* cited by examiner

METHODS AND APPARATUS FOR ENCODING AND DECODING OF DATA USING CONCATENATED POLARIZATION ADJUSTED CONVOLUTIONAL CODES

TECHNICAL FIELD

The present disclosure is directed generally to methods and apparatus for encoding and decoding of data using concatenated polarization adjusted convolutional codes.

BACKGROUND

In modern digital data transmission (wireless telephony, wireless data transmission, optical disk transmission to a player, music players receiving music data, and so on), a channel encoder can receive a data block and add redundancy to it (by passing the data block through a transformation) to produce a coded block that is better protected against noise in a transmission channel than the data block from which it is derived. The coded block is transmitted over the transmission channel and the transmission channel produces a received block at its output, where the received block is a version of the coded block corrupted by channel noise and/or distortion. A channel decoder processes the received block to produce a decoded data block and forwards the decoded data block to a destination, e.g., a music player, which plays the decoded data as audio, or a storage device, which stores the decoded data as a file.

A frame error is said to occur during transmission if the decoded data block is not an identical copy of the data block. A generally accepted design goal for channel coding is to reduce the frame error rate (FER) to acceptable levels. Channel codes that reduce the FER at the cost of too much computation are of little practical use. There exist many classes of channel codes, such as linear block codes, that are able to achieve an acceptable tradeoff between FER and complexity of implementation. A subclass of linear block codes is the subclass of triangular factorization (TF) codes introduced in the U.S. patent application of [ARI2019a], incorporated herein by reference and included in the file history of this application. The present principles are concerned primarily with a special case of TF codes called polarization adjusted convolutional (PAC) codes [ARI2019a], [ARI2019b], which combine convolutional coding with channel polarization [ARI2009]. PAC codes can be decoded using a low-complexity depth-first search method, called sequential decoding. In [ARI2019a], [ARI2019b], sequential decoding was adapted to PAC codes. A simulation study given in [ARI2019a], [ARI2019b] demonstrated that a certain PAC code of block length 128 is capable of achieving near-optimal FER performance under sequential decoding.

The object of the present principles is to provide solutions to certain problems that currently limit the practical utility of PAC codes. First, there is need for reducing the adverse effects of the variability of computational complexity in sequential decoding of PAC codes. The complexity of sequential decoding is highly sensitive to the severity of noise in the channel, which becomes the primary impediment to applying sequential decoding to PAC codes.

Second, there is need for leveraging the near-optimal performance of short PAC codes to build longer codes that can achieve extremely low FER values (such as $10^{-15}$) that are required in certain applications, such as fiber-optic data transmission or hard-disk data storage.

Third, PAC codes are designed to be decoded sequentially. Decoding decision have to be made in a fixed order so as to exploit the benefits of channel polarization. On the other hand, the sequential nature of decoding presents a throughput bottleneck, severely limiting the number of bits that can be communicated between the source and the destination. Although pipelining and unrolling techniques may be used to improve the throughput in hardware implementations of PAC decoders, such techniques require extra memory between pipeline stages, which increases chip area and cost. Increasing clock speeds in order to increase throughput does not solve the throughput problem either because increased clock speeds cause power-density problems in VLSI circuits. The only viable option for scaling the throughput of data processing systems has become the use of multi-core processors; see [ZAB2013] for an elaboration of this point. There is need for coding architectures that are custom designed for multi-core implementations so that multiple copies of PAC codes can be encoded and decoded independently in parallel.

The present principles address the above issues by introducing a concatenated coding scheme that employs PAC codes as inner codes. As background, we present some results on sequential decoding and concatenated coding.

Sequential decoding is a decoding method originally developed for convolutional codes [FAN1963]. The computation problem in sequential decoding is a well-studied problem in the context of conventional convolutional codes. In [JAC1967], it is shown that computation in sequential decoding is a random variable with a Pareto distribution, which is a probability distribution with heavy tails. It is also shown in [JAC1967] that the mean of the computational complexity in sequential decoding becomes unbounded at data transmission rates beyond a certain threshold rate, called the (computational) cutoff rate. Unfortunately, the cutoff rate of sequential decoding may be significantly smaller than the channel capacity.

There are several methods in the prior art that circumvent the cutoff rate barrier by employing multiple sequential decoders in parallel in various concatenation schemes. One such method is a concatenated coding scheme presented in [FAL1969], which employs (conventional) convolutional codes as inner codes and Reed-Solomon codes as outer codes. The outer Reed-Solomon codes place algebraic constraints across the inputs to the inner convolutional codes. At the receiver side, each inner convolutional code is decoded by a separate sequential decoder. The outer Reed-Solomon code is tasked with correction of errors and erasures left behind by the inner sequential decoders. Although [FAL1969] showed that this type of concatenated coding can achieve channel capacity at finite average complexity per decoded bit, the method in [FAL1969] was still far from being practical for the technology of the day.

We now turn to a review of concatenated coding. Although concatenated coding dates back to the product coding idea of [ELI1954], the seminal work on concatenated coding is [FOR1965], where concatenated coding was introduced as a method of building long codes out of short ones. Later work significantly generalized the basic ideas of [FOR1965] and introduced "generalized concatenated coding" (GCC) and "multilevel coding" (MLC); see, e.g., [ZYA1999]. In GCC/MLC schemes, there is a layered inner code and multiple outer codes whose rates need not be identical. By proper choice of the types and parameters of the inner and outer codes in a GCC/MLC scheme, one can obtain a rich set of tradeoffs between FER performance and complexity. The method in [FAL1969] may be regarded as a limited form of generalized concatenation method, limited in the sense that all outer codes operate at the same rate. In the context of polar coding, GCC/MLC schemes have been studied in [ARI2009] and [MAH2016].

The present disclosure introduces GCC/MLC coding techniques in connection with PAC codes. Constructing GCC/MLC schemes with PAC inner codes involves a number of novel problems, such as, introducing a layered structure to PAC codes, optimization of the number of layers and the payload capacity of each layer, introducing efficient methods for detecting errors in the decoding of individual layers of the inner PAC codes. There are also the more general GCC/MLC design problems of balancing the error-correction capability and implementation complexity of inner and outer codes. The present disclosure introduces methods to solve these design problems for GCC/MLC schemes with PAC inner codes.

If we compare the present principles with the concatenation scheme in [FAL1969], several major differences stand out. First, the concatenation scheme of [FAL1969] uses (conventional) convolutional codes as inner codes, while inner codes in the present disclosure are based on PAC codes. Convolutional codes have a uniform tree structure (often represented by a trellis), while PAC codes have a non-uniform tree structure, where the tree structure is designed to match channel polarization effects created by a polar transform. Second, the outer codes in the concatenation scheme of [FAL1969] are identical to each other, while the more general GCC/MLC concatenation methods employed by the present principles call for protecting each layer of the inner PAC code by a layer-specific outer code, where the layer-specific outer code is customized to the statistics of errors and erasures remaining at that layer after inner decoding. Third, the inner decoder in [FAL1969] is a standard sequential decoder for convolutional codes, while the inner decoder according to the present principles is a sequential decoder that is customized to channel polarization effects. The customization involves using a metric with a "look-ahead" capability and a non-uniform "bias". The customization further involves introducing a "time-out rule" so as to curb excessive computation in sequential decoding, where the time-out rule is customized for the non-uniform structure of the PAC tree code. Other major differences between the prior art and the present principles will be elaborated in the sequel.

To summarize, the present disclosure introduces GCC/MLC methods that improve the practical utility of PAC codes by providing computational diversity to mitigate the adverse effects of the variability of computation in sequential decoding, while at the same time providing a PAC coding architecture that is capable of delivering extreme reliability and scalable throughput.

REFERENCES

[ARI2009] E. Arikan, "Channel polarization: A method for constructing capacity-achieving codes for symmetric binary-input memoryless channels," IEEE Transactions on Information Theory, vol. 55, no. 7, pp. 3051-3073, July 2009.

[ARI2019a] E. Arikan, "Methods and apparatus for error correction coding with triangular factorization of generator matrices," U.S. patent application Ser. No. 16/453,887, 26 Jun. 2019.

[ARI2019b] E. Arikan, "From sequential decoding to channel polarization and back again," arXiv: 1908.09594 [cs, math], 26 Aug. 2019.

[ARI2009] Arikan, E., & Markarian, G. (2009, July 13). Two-dimensional polar coding. *Proc. Tenth International Symposium on Coding Theory and Applications (ISCTA '09)*. Ambleside, UK.

[ELI1954] Elias, P. (1954). Error-free Coding. *Transactions of the IRE Professional Group on Information Theory*, 4(4), 29-37.

[FAL1969] Falconer, D. D. (1969). A hybrid coding scheme for discrete memoryless channels. *The Bell System Technical Journal*, 48(3), 691-728.

[FAN1963] Fano, R. (1963). A heuristic discussion of probabilistic decoding. *IEEE Transactions on Information Theory*, 9(2), 64-74.

[FOR1965] Forney Jr, G. D. (1965). *Concatenated Codes* (Technical Report No. 440). Massachusetts Institute of Technology.

[JAC1967] Jacobs, I., & Berlekamp, E. (1967). A lower bound to the distribution of computation for sequential decoding. *IEEE Transactions on Information Theory*, 13(2), 167-174.

[MAH2016] Mandavifar, H., El-Khamy, M., Lee, J., & Kang, I. (2016). *Method and system for encoding and decoding data using concatenated polar codes* (U.S. Pat. No. 9,362,956B2).

[ZAB2013] Zabinski, P. J., Gilbert, B. K., & Daniel, E. S. (2013). Coming Challenges with Terabit-per-Second Data Communication. *IEEE Circuits and Systems Magazine*, 13(3), 10-20.

[ZYA1999] Zyablov, V., Shavgulidze, S., & Bossert, M. (1999). An Introduction to Generalized Concatenated Codes. *European Transactions on Telecommunications*, 10(6), 609-622.

The above-listed publications are incorporated herein by reference.

SUMMARY

In one embodiment, a concatenated encoder apparatus for use in a communication system includes an outer encoder configured to receive a concatenated encoder input block d, split the concatenated encoder input block d into an outer code input array a, and encode the outer code input array a in accordance with a plurality of outer codes to generate an outer code output array b, and an inner encoder configured to generate, from the outer code output array b, a concatenated code output array x in accordance with a layered polarization adjusted convolutional (LPAC) code, and send the concatenated code output array x to a channel. The plurality of outer codes comprises at least two outer codes and the LPAC code comprises at least two layers. The inner encoder is optionally further configured to compute a precoding array c from the outer code output array b and insert the precoding array c into the data container array v. The LPAC code optionally comprises a data index set $\mathcal{A}$ and a partition of the data index set $\mathcal{A}$ into a plurality of layer index sets ($\mathcal{A}_1, \mathcal{A}_2, \ldots, \mathcal{A}_L$), where the plurality of layer index sets ($\mathcal{A}_1, \mathcal{A}_2, \ldots, \mathcal{A}_L$) are chosen in accordance with a score function, and the score function is one of a Hamming score function, a reliability score function, a decoding order score function, or a combination thereof.

In another embodiment, a concatenated decoder apparatus for use in a communication system includes a layer counter configured to count a number of layers and an inner decoder configured to carry out an ith layer inner decoding operation in accordance with a layered polarization adjusted convolutional code (LPAC) to generate an ith inner decoder decision $\hat{b}_i$ from a concatenated decoder input array y and an (i−1)th cumulative decision feedback ($\hat{b}_1, \hat{b}_2, \ldots \hat{b}_{i-1}$). The concatenated decoder also includes an outer decoder configured to carry out an ith layer outer decoding operation to generate from the ith inner decoder decision $\hat{b}_i$ an ith outer decoder decision $\hat{a}_i$, and a reencoder configured to carry out an ith layer reencoding operation to generate an ith decision feedback $\hat{b}_i$ from the ith outer decoder decision $\hat{a}_i$, where the number of layers is equal to an integer m, the integer m is greater than one, and the outer encoder is further configured to generate a concatenated decoder output block $\hat{d}$ from outer decoder decisions ($\hat{a}_1, \hat{a}_2, \ldots, \hat{a}_m$) and send the concatenated decoder output block $\hat{d}$ to a destination. The ith layer inner decoding operation optionally comprises employing a sequential decoder for decoding the LPAC code. The sequential decoder is optionally equipped with a computational time-out limit.

DETAILED DESCRIPTION

Figure 1:
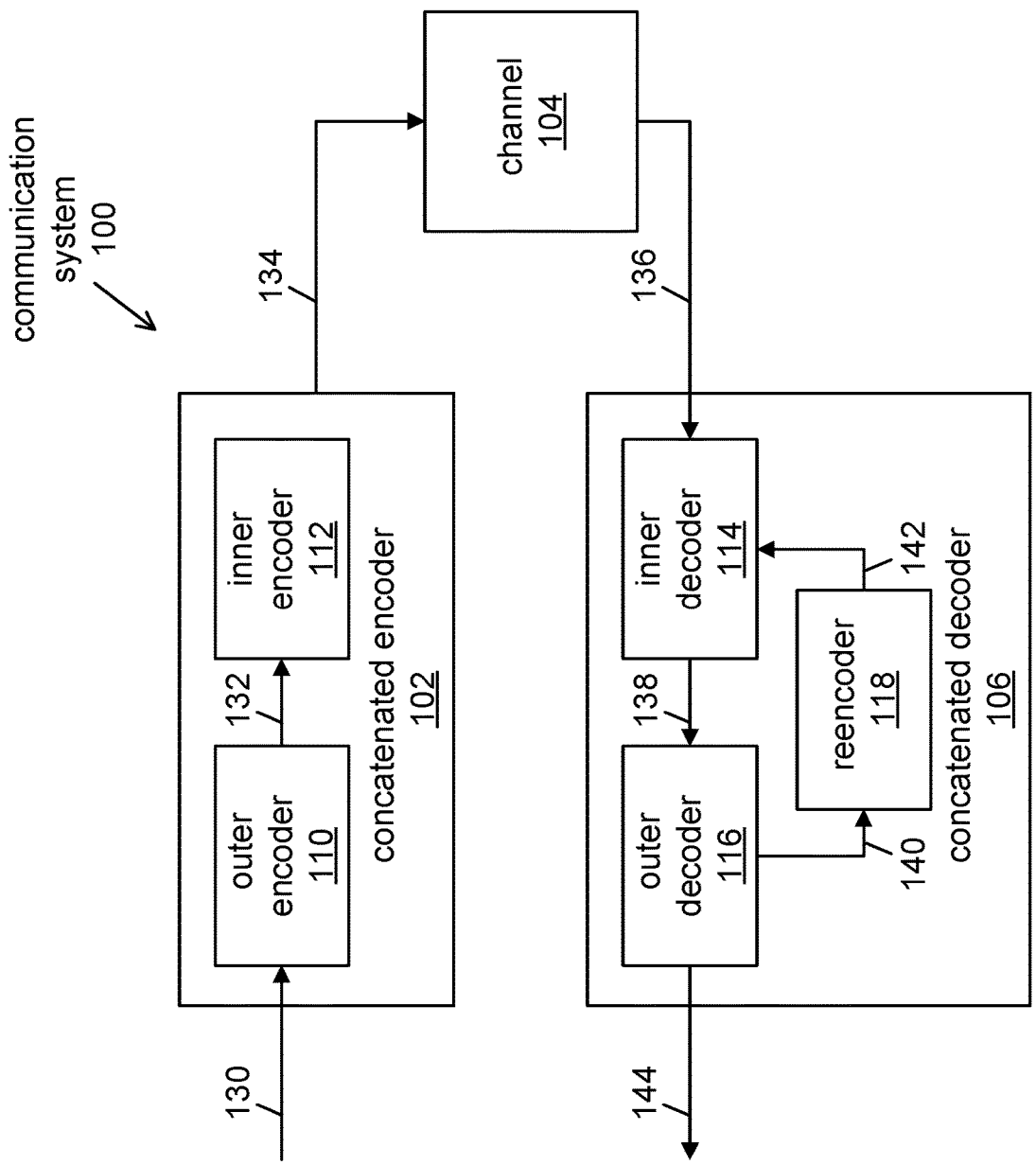
FIG. 1 is a block diagram illustrating a communication system 100 in which embodiments of the present principles may be used.

FIGS. 1 through 5B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

Notation. For $\mathcal{A}$ a subset of a universal set, $\mathcal{A}^c$ denotes the complement of $\mathcal{A}$ with respect to the universal set. For $\mathcal{A}$ and $\mathcal{B}$ any two subsets of a universal set, the notation $\mathcal{A} \setminus \mathcal{B}$ denotes the set difference, namely, $\mathcal{A} \setminus \mathcal{B} = \mathcal{A} \cap \mathcal{B}^c$. For $\mathcal{A}$ a set, $|\mathcal{A}|$ denotes the number of elements in $\mathcal{A}$. The symbol $\mathbb{F}_q$ denotes the finite field with elements $\{0, 1, \ldots, q-1\}$. We write $a \in \mathbb{F}_q^N$ to indicate that a is a row vector $a=(a_1, a_2, \ldots, a_N)$ with $a_i \in \mathbb{F}_q$ for $i=1, 2, \ldots, N$. For $a=(a_1, a_2, \ldots, a_N)$ and $1 \leq i \leq j \leq N$, we write $a_i^j$ to denote the subvector $a_i^j=(a_i, a_{i+1}, \ldots, a_j)$ if $i>j$, then $a_i^j$ is the null vector. We write $a^j$ instead of $a_1^j$ when $i=1$. For $a \in \mathbb{F}_q^N$ and $\mathcal{S} \subset \{1, 2, \ldots, N\}$, $a_\mathcal{S}$ denotes the subvector $a_\mathcal{S} = (a_i: i \in \mathcal{S})$ that consists of the elements of a with indices in $\mathcal{S}$; likewise, $a_{\mathcal{S}^c} = (a_i: i \in \mathcal{S}^c)$ denotes the subvector that consists of the elements of a with indices in the set $\mathcal{S}^c$, where $\mathcal{S}^c$ denotes the complement of $\mathcal{S}$ in $\{1, 2, \ldots, N\}$. For example, if N=8 and $\mathcal{S} = \{1, 2, 3, 5, 8\}$, then, $a_\mathcal{S} = (a_1, a_2, a_3, a_5, a_8)$ and $a_{\mathcal{S}^c} = (a_4, a_6, a_7)$. By convention, the coordinates of a appear in $a_\mathcal{S}$ in the increasing order; thus, whether $\mathcal{S}$ is specified as $\mathcal{S} = \{1, 2, 3, 5, 8\}$ or $\mathcal{S} = \{2, 3, 1, 5, 8\}$, the subvector $a_\mathcal{S}$ is the same vector $a_\mathcal{S} = (a_1, a_2, a_3, a_5, a_8)$. The notation $\mathbb{F}_q$ stands for the finite field with elements $\mathbb{F}_q = \{1, 2, \ldots, q-1\}$. We use the notation "$a \stackrel{\text{def}}{=} b$" to mean "a equals b by definition."

For X a random variable (or a chance variable) and x a possible realization of X, the notation $P_X(x)$ denotes the probability of the event $\{X=x\}$. For (X, Y) jointly distributed random variables and (x, y) a possible realization of the pair (X, Y), $P_{X,Y}(x,y)$ denotes the probability of $\{X=x, Y=y\}$, and $P_{Y|X}(y|x)$ denotes the conditional probability of $\{Y=y\}$ given $\{X=x\}$.

We say that "$\mathcal{C}$ is a code over $\mathbb{F}_q$ with dimension K and block length N" if $\mathcal{C}$ is a mapping from $\mathbb{F}_q^K$ to $\mathbb{F}_q^N$, written $\mathcal{C}$: $\mathbb{F}_q^K \to \mathbb{F}_q^N$. The ratio R=K/N is called the rate of the code $\mathcal{C}$. An encoder for the code $\mathcal{C}$ is any method or apparatus that implements the mapping $\mathcal{C}$: $\mathbb{F}_q^K \to \mathbb{F}_q^N$. We refer to each element in the domain $\mathbb{F}_q$ of $\mathcal{C}$ as an "input block" and each element in the range $\mathbb{F}_q^N$ of $\mathcal{C}$ as an "output block". Input and output blocks of a code $\mathcal{C}$ are also called "messages" and "code words", respectively. We represent input and output blocks of a code $\mathcal{C}$ by row vectors, such as $d \in \mathbb{F}_q^N$ and $x \in \mathbb{F}_q^N$, respectively. We say that "x belongs to $\mathcal{C}$" if there exists an input block d that gets mapped into x by $\mathcal{C}$. Sometimes we say that "x is the code word in $\mathcal{C}$ corresponding to the input block d" if d is mapped into x by $\mathcal{C}$. We write $x=\mathcal{C}(d)$ to indicate that x is the code word in $\mathcal{C}$ corresponding to the message block d.

PAC codes. We start with a review of the prior art on PAC coding to establish some basic concepts that will be needed in the presentation of the present principles. PAC codes were first disclosed, as a most preferred embodiment of TF codes, in E. Arikan, "Methods and apparatus for error correction coding with triangular factorization of generator matrices," U.S. patent application Ser. No. 16/453,887, filed 26 Jun. 2019, incorporated herein by reference. A tutorial discussion of PAC codes appears in the article E. Arikan, "From sequential decoding to channel polarization and back again," arXiv: 1908.09594 [cs, math], 26 Aug. 2019.

A PAC code over $\mathbb{F}_2$ is a linear block code characterized by a collection of parameters (N, K, $\mathcal{A}$, g), wherein N is a block length, wherein $N=2^n$ for some integer $n \geq 1$, wherein K is a dimension, wherein the dimension K is an integer in the range $0 \leq K \leq N$, wherein $\mathcal{A}$ is a data index set, wherein the data index set $\mathcal{A}$ is a subset of $\{1, 2, \ldots, N\}$ with size $|\mathcal{A}|=K$, wherein f is a frozen block, wherein the frozen block f is a fixed vector that belongs to $\mathbb{F}_2^{N-K}$, wherein g is an impulse response of a convolution operation, wherein the convolution impulse response g is a fixed vector of the form $g=(g_0, g_1, \ldots, g_M) \in \mathbb{F}_2^{M+1}$, wherein $g_0 \neq 0$, $g_M \neq 0$, and $M \geq 1$.

The restrictions $g_M \neq 0$ and $M \geq 1$ ensure that the trivial convolution operation corresponding to g=1 (identity mapping) is excluded from the definition of PAC codes, which ensures that certain prior art codes, such as, polar codes and Reed-Muller codes, are excluded from the class of PAC codes.

The choice of the frozen block f is not a critical design issue; it may be set to an all-zero vector. The FER performance and decoding complexity of PAC codes depend critically on the choice of the data index set $\mathcal{A}$. U.S. patent application Ser. No. 16/453,887 describes several methods for constructing the data index set A based on various "score functions". Here, we present the score function approach in a slightly different but equivalent form.

A score function is any function s: $\{1, 2, \ldots, N\} \to \mathbb{R}$ (real numbers) that assigns a real number (a score) to each index $i \in \{1, 2, \ldots, N\}$. Given a score function s, the data index set $\mathcal{A}$ is chosen so that $\sum_{i \in \mathcal{A}} s(i)$ is maximized subject to $\mathcal{A} \subset \{1, 2, \ldots, N\}$ and $|\mathcal{A}|=K$. Two important score functions for PAC code construction are the Hamming score function and the reliability score function.

The Hamming score function of an index $i \in \{1, 2, \ldots, N\}$ is defined as $s_H(i) = \sum_{j=0}^{n-1} b_j$, wherein $n = \log_2 N$ and $b_0, b_1, \ldots, b_{n-1} \in \mathbb{F}_2$ are the coefficients in the binary representation of $(i-1)$, namely, $\sum_{j=0}^{n-1} b_j 2^j = i-1$. For example, $s_H(14) = 3$ since $14 - 1 = 13 = 1 + 2^2 + 2^3$.

The reliability score function of an index $i \in \{1, 2, \ldots, N\}$ is defined as $s_R(i) = 1 - P_{e,i}$, wherein $P_{e,i}$ is defined as the probability of the event that a successive cancellation decoder for a polar code will make an error at the ith stage of decoding. The person skilled in the art will know that the quantities $\{P_{e,i}\}$ can be computed by standard polar code construction methods, such as the density-evolution method.

A drawback of the reliability score function is that it generates channel-specific PAC code designs. Channel-specific code designs may not work well if the channel model used in the code design does not match the characteristics of the channel 104 that is actually used. The Hamming score function, on the other hand, generates channel-independent designs. In the context of polar coding (namely, for g=1), the person skilled in the art will recognize that the Hamming and reliability score functions generate Reed-Muller and polar codes, respectively. Based on this observation, it may be expected that the Hamming score function emphasizes code minimum distance in PAC code construction, while the reliability score function emphasizes PAC code constructions that are better adapted to channel polarization effects.

Next we review prior-art methods for encoding and decoding of PAC codes. For this, let $\mathcal{C}_{PAC}$ be a fixed but otherwise arbitrary PAC code with parameters $(N, K, \mathcal{A}, f, g)$.

Encoding of the PAC code $\mathcal{C}_{PAC}$ comprises receiving an input block $d \in \mathbb{F}_2^K$, generating a data container block $v \in \mathbb{F}_2^N$ from the input block by setting $v_\mathcal{A} = d$ and $v_{\mathcal{A}^c} = f$, generating a convolution output block $u \in \mathbb{F}_2^N$ from the data container block v by computing a convolution $u = g \circledast v$, and generating an output block $x \in \mathbb{F}_2^N$ by applying a polar transform $x = uF^{\otimes n}$ to the convolution output block u, wherein $v_\mathcal{A}$ is the subvector of v comprising the coordinates in $\mathcal{A}$, wherein $v_{\mathcal{A}^c}$ is the subvector of $v_{\mathcal{A}^c}$ comprising the coordinates in $\mathcal{A}^c$, wherein 0 is an all-zero vector of length N−K, wherein $$F = \begin{bmatrix} 1 & 0 \\ 1 & 1 \end{bmatrix},$$

and wherein $F^{\otimes n}$ is the nth Kronecker power of F. The convolution $u = g \circledast v$ is given by the formula $u_i = g_0 v_i + g_1 v_{i-1} + \ldots + g_j v_{i-j} + \ldots + g_i v_{i-1}$ for $1 \le i \le N$, wherein the addition and multiplication are in $\mathbb{F}_2$, wherein $u_i$ is the ith element of u, $v_k$ is the kth element of v, and $v_k$ is interpreted as 0 if $k \le 0$.

To discuss decoding of the PAC code $\mathcal{C}_{PAC}$, suppose the output block x of the PAC code $\mathcal{C}_{PAC}$ is transmitted over a channel and a channel output block y is received at the channel output. Let $P_{Y|X}(y|x)$ denote the channel probability assignment, namely, the conditional probability that y is received at the channel output given that x is transmitted at the channel input. (Here, X and Y represent the random vectors at the channel input and output, respectively.) Suppose also that the PAC encoder input block d is chosen uniformly at random over $\mathbb{F}_2^K$. The uniform probability assignment on d and the channel probability assignment $P_{Y|X}(y|x)$ determine a joint probability assignment for the variables that appear below in sequential decoding of the PAC code $\mathcal{C}_{PAC}$.

We will discuss decoders for the PAC code $\mathcal{C}_{PAC}$ by viewing decoders as tree search algorithms. To that end, we associate a code tree to the PAC code $\mathcal{C}_{PAC}$, wherein the code tree comprises an ith level for each integer i in the range $0 \le i \le N$, wherein the ith level comprises a plurality of nodes, wherein each node at the ith level of the code tree is associated with an ith initial segment $v^i \stackrel{\text{def}}{=} (v_1, v_2, \ldots, v_i)$ of the data container block $v = (v_1, v_2, \ldots, v_N)$, wherein $v^{i=0}$ is interpreted as a null vector, wherein the (i=0)th level of the code tree comprises a single node, called a root node, wherein the root node is associated with the null vector $v^0$. The data index set $\mathcal{A}$ determines the structure of the code tree. To each choice of the data index set $\mathcal{A}$, there corresponds a rate profile $\{R_1, R_2, \ldots, R_N\}$, wherein $R_i$ is defined as the fraction of elements in $\{1, 2, \ldots, i\}$ that belong to $\mathcal{A}$, namely, $R_i \stackrel{\text{def}}{=} |\mathcal{A} \cap \{1, 2, \ldots, i\}|/i$. We interpret $iR_i$ as the number of "free coordinates" in the ith initial segment $v^i = (v_1, v_2, \ldots, v_i)$. (The rest of the coordinates of $v^i$ are constrained to 0 by the encoding rule $v_{\mathcal{A}^c} = 0$). Thus, the number of nodes at the ith level of the code tree is given by $2^{iR_i}$, with the understanding that at level i=0, there is only the root node.

The convolution mapping $u = g \circledast v$ establishes a one-to-one correspondence between the initial segments $v^0, v^1, v^2, \ldots, v^N$ of v and the initial segments $u^0, u^1, u^2, \ldots, u^N$ of u. Hence, the nodes at the ith level of the code tree for the PAC code $\mathcal{C}_{PAC}$ can be identified either by $v^i$ or by $u^i$. In the following description, we will identify the nodes in the code tree by the initial segments $v^0, v^1, v^2, \ldots, v^N$ of the data container block v.

An encoding operation for the PAC code $\mathcal{C}_{PAC}$ is equivalent to selecting a correct path through the code tree for the PAC code, wherein the correct path is the path that traverses the sequence of nodes $v^0, v^1, v^2, \ldots, v^N$ corresponding to the initial segments of the data container block v. Equivalently, the correct path traverses the sequence of nodes $u^0, u^2, \ldots, u^N$ corresponding to the initial segments of the convolution output block u.

Decoding of the PAC code $\mathcal{C}_{PAC}$ may be viewed as a search for the correct path in the code tree for $\mathcal{C}_{PAC}$. Given the channel output block y, a decoder searches the code tree and generates an estimate $\hat{v}^0, \hat{v}^1, \hat{v}^2, \ldots, \hat{v}^N$ of the path $v^0, v^1, v^2, \ldots, v^N$ along the actual data container block $v = v^N$ at the encoder. Given an estimate $\hat{v} \stackrel{\text{def}}{=} \hat{v}^N$ of the data container block v, one extracts an estimate $\hat{d}$ of the encoder input block d by setting $\hat{d} = \hat{v}_\mathcal{A}$.

Clearly, any tree search method can serve as a decoder for the PAC code $\mathcal{C}_{PAC}$. U.S. patent application Ser. No. 16/453,887 discusses sequential decoding (a depth-first search heuristic), and mentions Viterbi decoding (a breadth-first search algorithm) and beam search (a suboptimal but less complex version of breadth-first search) as some alternatives to sequential decoding. The present disclosure is primarily based on sequential decoding of PAC codes.

Sequential decoding of PAC codes. Sequential decoding of the PAC code $\mathcal{C}_{PAC}$ comprises a depth-first search for the correct path in the code tree for the PAC code $\mathcal{C}_{PAC}$, wherein the search is guided by a Fano metric $$\Gamma(u^i, y) \stackrel{\text{def}}{=} \log_2 \frac{P_{Y|U^i}(y \mid u^i)}{P_Y(y)} - B_i,$$

wherein $P_{Y|U^i}(y|u^i)$ is the conditional probability assignment on the channel output y given that the correct path passes through node $u^i$, $P_Y(y)$ is the probability assignment on the channel output blocky, and $B_i$ is an ith level cumulative bias term. As pointed out in U.S. patent application Ser. No. 16/453,887, the Fano metric can be computed incrementally by writing $$\Gamma(u^i, y) = \Sigma_{j=1}^i \gamma(u_j, y|u^{j-1}),$$

wherein $\gamma(u_j, y|u^{j-1})$ is a Fano branch metric defined as $$\gamma(u_j, y \mid u^{j-1}) = \log_2 \frac{P_{Y|U^j}(y \mid u^j)}{P_{Y|U^{j-1}}(y \mid u^{j-1})} - b_j,$$

wherein $b_j = B_j - B_{j-1}$ is a jth level bias term. The Fano branch metric can be written alternatively as $$\gamma(u^j, y|u^{j-1}) = \log_2 P_{U_j|Y, U^{j-1}}(u_j|y, u^{j-1}) - b_j + 1,$$

which may be advantageous for numerical stability in computations. For successful operation of sequential decoding, the bias terms $\{b_j\}$ have to be chosen so that the Fano branch metric $\gamma(u_j, y|u^{j-1})$ tends to increase on the correct path and decrease on incorrect paths.

The sequential decoding algorithm prioritizes its search in accordance with the value $\Gamma(u^i, y)$ assigned by the Fano metric to the nodes $u^i$ in the code tree of the PAC code $\mathcal{C}_{PAC}$. There exist various versions of the sequential decoding algorithm, such as the "Fano" algorithm and the "stack" algorithm, which differ in implementation details. The stack algorithm is easier to explain but the Fano algorithm is more practical for implementation purposes. For details of both algorithms we refer to prior art on sequential decoding. For details of sequential decoding of PAC codes we refer to U.S. patent application Ser. No. 16/453,887. Here, we will only sketch the operation of the stack algorithm.

Stack algorithm. A stack is a data structure consisting of a variable number of records, where the records comprise a node id and a metric value. The records in the stack are maintained in sorted order with respect to their metric values, with the "top" node having the largest metric value. Initially, the stack is empty. The stack algorithm begins the tree search by inserting the root node $\hat{u}^0 = u^0$ to the stack (as the top node) with a metric value $\Gamma(\hat{u}^0, y) = 0$. Clearly, the initial hypothesis $\hat{u}^0$ about the actual root node $u^0$ is correct since there is only one node at level 0. Next, the root node $\hat{u}^0$ is removed from the stack top, each hypothetical continuation $\hat{u}^1$ of $\hat{u}^0$ is inserted into the stack, and the stack is sorted again so as to maintain the order with respect to metric values. At a general step of the stack algorithm, the stack top contains a node $\hat{u}^i$ at some level i in the code tree. The node $\hat{u}^i$ is removed from the stack top, the metric values $\Gamma(\hat{u}^{i+1}, y)$ are computed for all possible continuations of $\hat{u}^{i+1}$ of $\hat{u}^i$, each new node $\hat{u}^{i+1}$ is inserted into the stack, and the stack is sorted again with respect to metric values of the current nodes. The stack algorithm completes sequential decoding as soon as a node $\hat{u}^N$ at the final level N of the code tree for the PAC code $\mathcal{C}_{PAC}$ appears at the stack top. At this point, we obtain an estimate $\hat{u} \stackrel{\text{def}}{=} \hat{u}^N$ of the convolution output block u. Since the convolution $u = g \circledast v$ is one-to-one, we invert the convolution to obtain an estimate $\hat{v}$ of the data container block v such that $\hat{u} = g \circledast \hat{v}$, and extract an estimate $\hat{d}$ of the encoder input block d from $\hat{v}$ by setting $\hat{d} = \hat{v}_\mathcal{A}$.

As pointed out in the BACKGROUND, a major drawback of sequential decoding is the variability of computation. The variability of computation is caused by rare noise bursts leading to exponentially large searches in the code tree, giving rise to a heavy-tailed Pareto distribution for search complexity. This problem is especially severe for sequential decoding of conventional convolutional codes for which the channel is not surrounded by a polar transform operation and the metric has the form $\Gamma(u^i, y^i)$. The PAC codes partially alleviate the computation problem by using a metric of the form $\Gamma(u^i, y)$, where the replacement of $y^i$ by y provides some "look-ahead" feature into the metric. However, the variability of computation in sequential decoding of PAC codes still remains a main impediment to the practical applicability of PAC codes. As a remedy, the present principles introduce concatenated coding schemes along with layered PAC (LPAC) codes.

LPAC codes. An LPAC code over $\mathbb{F}_2$ is a linear block code characterized by a collection of parameters (N, K, $\mathcal{A}, \mathcal{L}_1, \mathcal{L}_2 \cdots, \mathcal{L}_L$, f, g), wherein N is a block length, wherein $N = 2^n$ for some integer $n \geq 1$, K is a dimension, wherein the dimension K is an integer in the range $0 \leq K \leq N$, wherein $\mathcal{A}$ is a data index set, wherein the data index set A is a subset of $\{1, 2, \ldots, N\}$ with size $|\mathcal{A}| = K$, wherein $\mathcal{L}_1$ is an ith layer index set, $1 \leq i \leq L$, wherein $(\mathcal{L}_1, \mathcal{L}_2 \cdots, \mathcal{L}_L)$ is a plurality of layer index sets, wherein the plurality of layer index sets $(\mathcal{L}_1, \mathcal{L}_2 \cdots, \mathcal{L}_L)$ partition the data index set $\mathcal{A}$ in the sense that $\mathcal{A} = \cup_{i=1}^L \mathcal{L}_i$ and $\mathcal{L}_i \cap \mathcal{L}_j = \emptyset$ for $1 \leq i \leq j \leq L$, wherein f is a frozen block, wherein the frozen block f is a fixed vector that belongs to $\mathbb{F}_2^{N-K}$, wherein g is an impulse response of a convolution operation, wherein the impulse response g is a fixed vector of the form $g = (g_0, g^1, \ldots, g_M) \in \mathbb{F}_2^{M+1}$, wherein $g_0 \neq 0$, $g_M \neq 0$, and $M \geq 1$.

It should be clear from their definitions that an LPAC code with parameters (N, K, $\mathcal{A}, \mathcal{L}_1, \mathcal{L}_2 \cdots, \mathcal{L}_L$, f, g) can be thought of being derived from a PAC code with parameters (N, K, $\mathcal{A}$, f, g) by choosing a partition $(\mathcal{L}_1, \mathcal{L}_2 \cdots, \mathcal{L}_L)$ of A. Conversely, a PAC code may be seen as an LPAC code with only one layer, L=1. The differences in the encoding of PAC codes and LPAC codes are minor. The layered structure of LPAC codes becomes significant only during decoding. The layered structure is designed for layered decoding, where external aid (from an outer decoder) may be received between the decoding of successive layers. For completeness, we give details of encoding and decoding of LPAC codes, although they are similar to the encoding and decoding of PAC codes.

Let $\mathcal{C}_{LPAC}$ be an LPAC code over $\mathbb{F}_2$ with parameters (N, K, $\mathcal{A}, \mathcal{L}_1, \mathcal{L}_2 \cdots, \mathcal{L}_L$, f, g), and let $d = (d_1, d_2, \ldots, d_L) \in \mathbb{F}_2^K$ be an input block such that $d_i$ is a vector over $\mathbb{F}_2$ with length $|\mathcal{L}_i|$ for each $1 \leq i \leq L$. (Here, $d_1$ stands for the first $|\mathcal{L}_1|$ elements of d, $d_2$ stands for the next $|\mathcal{L}_2|$ elements of d, and so on.) Encoding of d into an output block $x \in \mathbb{F}_2^N$ comprises generating a data container block $v \in \mathbb{F}_2^N$ by setting $v_{\mathcal{L}_i} = d_i$ for $1 \leq i \leq L$ and $v_{\mathcal{A}^c} = f$, generating a convolution output block $u \in \mathbb{F}_2^N$ from the data container block v by computing a convolution $u = g \circledast v$, and generating an output block $x \in \mathbb{F}_2^N$ by applying a polar transform to the convolution output block u, namely, by setting $x = uF^{\otimes n}$, wherein $v_\mathcal{A}$ is the subvector of v comprising the coordinates in $\mathcal{A}$, wherein $v_{\mathcal{A}^c}$ is the subvector of $v_{\mathcal{A}^c}$ comprising the coordinates in $\mathcal{A}^c$, wherein 0 is an all-zero vector of length N–K, wherein $$F = \begin{bmatrix} 1 & 0 \\ 1 & 1 \end{bmatrix},$$

and wherein $F^{\otimes n}$ is the nth Kronecker power of F. The convolution $u = g \circledast v$ is given (using $\mathbb{F}_2$ arithmetic) by the formula $u_i = g_0 v_i + g_1 v_{i-1} + \ldots g_j v_{i-j} + \ldots + g_M v_{i-1}$ for $1 \le i \le N$, wherein $u_i$ is the ith element of u, $v_k$ is the kth element of v, and $v_k$ is interpreted as 0 if $k \le 0$.

To illustrate layered decoding, of the LPAC code $C_{LPAC}$, suppose $d = (d_1, d_2, \ldots, d_L)$ is the encoder input (invisible to the decoder) and $y \in \mathbb{F}_2^N$ is the channel output. Layered decoding begins by decoding a first-layer PAC code $C_1$ derived from the first layer of the LPAC code and characterized by the parameters (N, $K_1 \stackrel{\text{def}}{=} K$, $\stackrel{\text{def}}{=}$, $f_1 \stackrel{\text{def}}{=} f$, g) using an arbitrary PAC decoder to obtain an initial estimate of $\tilde{v} = (\tilde{v}_1, \tilde{v}_2, \ldots, \tilde{v}_N)$ of the data container block $v = (v_1, v_2, \ldots, v_N)$ from a channel output blocky, and extracting an initial estimate $\tilde{d}_1$ of the first layer data block $d_1$ by setting $\tilde{d}_1 = \tilde{v}_{\mathcal{L}_1}$. (Note that a decoder for the LPAC code $C_{LPAC}$ does not have to produce the entire initial estimate $\tilde{v} = (\tilde{v}_1, \tilde{v}_2, \ldots, \tilde{v}_N)$ in order to obtain $\tilde{d}_1$; it suffices to produce only a partial initial estimate $\tilde{v}_{\mathcal{L}_1}$. This observation may be useful in reducing the complexity of layered decoding.)

The main advantage of layered decoding is to give an external agent (such as an outer code in a concatenated coding system) a chance to correct any errors in the initial estimate $\tilde{d}_1$ and provide a final estimate $\hat{d}_1$ of $d_1$ by utilizing some external information. The succeeding stages of layered decoding are carried out based on the assumption that $d_1 = \hat{d}_1$. If $d_1 \ne \hat{d}_1$, then the layered decoder will never recover form this error; on the other hand, if $\hat{d}_1$ is correct, the decoding problem reduces to a smaller (and easier) instance of a PAC decoding problem. Some layered decoders may receive an indication that $\hat{d}_1$ is wrong, e.g., due to failure of certain parity-check bits or due to an outer decoder failing to produce a valid decoded output; in such cases, decoding of the LPAC code is aborted. If there is no such indication that $\hat{d}_1$ is false, the decoder continues with the decoding of the second layer.

The second layer decoding is carried out on a second-layer PAC code $C_2$ derived from the second layer of the LPAC code and characterized by the parameters (N, $K_2 \stackrel{\text{def}}{=} K - |\mathcal{L}_1|$, $\mathcal{A}_2 \stackrel{\text{def}}{=} \mathcal{A} \setminus \mathcal{L}_1$, $f_2$, g), wherein $f_2 \in \mathbb{F}_2^{N-K_2}$ comprises the coordinates of $f_1$ and $\hat{d}_1$ in a certain order as determined by the index sets $\mathcal{A}_1^c$ and $\mathcal{L}_1$. More precisely, $f_2$ is obtained by considering a vector $\alpha \in \mathbb{F}_2^N$ with $\alpha_{\mathcal{A}_1^c} = f_1$ and $\alpha_{\mathcal{L}_1} = \hat{d}_1$ (the remaining coordinates of $\alpha$ are immaterial here) and setting $f_2 = \alpha_{\mathcal{A}_2^c}$. (Note that $\mathcal{A}_2^c = \mathcal{A}_1^c \cup \mathcal{L}_1$.)

Layered decoding continues with a decoding of the second-layer PAC code $C_2$, using the same type of decoding procedure as in the decoding of the first-layer PAC code $C_1$. The decoding of the second-layer PAC code $C_2$ begins with the output block y as decoder input and ends with an initial estimate $\tilde{d}_2$ of the second-layer data block $d_2$. As in first-layer decoding, an external agent receives $\tilde{d}_2$ and provides a final estimate $\hat{d}_2$ of $d_2$ by utilizing some external information.

In general, in an ith round of decoding, the layered decoder decodes an ith-layer PAC code $C_i$ derived from the ith layer of the LPAC code and characterized by the parameters (N, $K_i \stackrel{\text{def}}{=} K - \Sigma_{k=1}^{i-1} |\mathcal{L}_k|$, $\mathcal{A}_i \stackrel{\text{def}}{=} \mathcal{A} \setminus \cup_{k=1}^{i-1} \mathcal{L}_k$, $f_i$, g), wherein $f_i \in \mathbb{F}_2^{N-K_i}$ comprises the coordinates of $f_{i-1}$ and $\hat{d}_{i-1}$ in a certain order as determined by the index sets $\mathcal{A} R_{i-1}^c$ and $\mathcal{L}_{i-1}$. More precisely, $f_i$ is obtained by considering a vector $\alpha \in \mathbb{F}_2^N$ with $\alpha_{\mathcal{A}_{i-1}^c} = f_{i-1}$ and $\alpha_{\mathcal{L}_{i-1}} = \hat{d}_{i-1}$, and setting $f_i = \alpha_{\mathcal{A}_i^c}$. (Note that $\mathcal{A}_i^c = \mathcal{A}_{i-1}^c \cup \mathcal{L}_1$.) At the end of rounds of decoding, one obtains a final estimate $\hat{d} = (\hat{d}_1, \hat{d}_2, \ldots, \hat{d}_L)$ of $d = (d_1, d_2, \ldots, d_L)$ and decoding is completed.

A critical aspect of the construction of LPAC codes is the selection of the data index set $\mathcal{A}$ and the partition of the data index set into layer index sets ($\mathcal{L}_1, 1\mathcal{L}_2, \ldots, \mathcal{L}_L$). The selection of the data index set $\mathcal{A}$ can be carried out using the score-function approach as described above in connection with the construction of PAC codes. The partition of the data index set $\mathcal{A}$ into layer index sets can also be carried out by the same type of score-function approach. Suppose a data index set $\mathcal{A}$ is given and suppose one wishes to partition $\mathcal{A}$ into a plurality of layer index sets ($\mathcal{L}_1, \mathcal{L}_2, \ldots, \mathcal{L}_L$) with a prescribed number of layers L and a prescribed size $|\mathcal{L}_i| = k_i$ for the ith layer index set $\mathcal{L}_i$ for each $1 \le i \le L$. The score function approach with a score function s: $\{1, 2, \ldots, N\} \to \mathbb{R}$ chooses the layer index sets one-by-one, in reverse order $\mathcal{L}_L, \mathcal{L}_{L-1}, \ldots, \mathcal{L}_1$, so that $\mathcal{L}_i$ maximizes $\Sigma_{i \in \mathcal{L}_i} s(i)$ over all sets $\mathcal{L}_i \in \mathcal{A} \setminus (\cup_{k=i+1}^L \mathcal{L}_k)$ such that $|\mathcal{L}_i| = k_i$, $1 \le i \le L$. (For $i = L$, we interpret $\cup_{k=i+1}^L \mathcal{L}_k$ as the null set.) Two preferred score functions for partitioning the data index set $\mathcal{A}$ into a plurality of layer index sets ($\mathcal{L}_1, \mathcal{L}_2, \ldots, \mathcal{L}_L$) are the Hamming and the reliability score functions, discussed above. A third score function for partitioning the data index set $\mathcal{A}$ into a plurality of layer index sets ($\mathcal{L}_1, \mathcal{L}_2, \ldots, \mathcal{L}_L$) is the decoding order score function $s_D$ for which $s_D(i) = N - i$ for $i \in \{1, 2, \ldots, N\}$.

Note that it is possible that the data index set A is chosen using one type of score function and the layer index sets ($\mathcal{L}_1, \mathcal{L}_2 \cdots, \mathcal{L}_L$) are chosen using a different type of score function.

The above procedure for constructing the layer index sets ($\mathcal{L}_1, \mathcal{L}_2 \cdots, \mathcal{L}_L$) treats the number of layers L and the sizes $\{k_i: 1 \le i \le L\}$ of the layers as given. The choice of the parameters L and $\{k_i: 1 \le i \le L\}$ depends on the type of outer codes that are used in the system.

We now turn to describing specific embodiments of the present principles with reference to FIGS. 1 through 5B.

FIG. 1 is a block diagram illustrating a communication system 100 according to an embodiment of the present principles. The term communication system is used here to include any kind of system for transmission or storage of data. Specific embodiments of the present principles described below are for illustration only. It will be apparent to the person skilled in the art that alternative embodiments of the present principles may be configured for reliable transmission or storage of data in a wide range of communication systems.

The main function of the communication system 100 is to carry data from a source to a destination by using a concatenated code $C$. The communication system 100 comprises a concatenated encoder 102, a channel 104, and a concatenated decoder 106. The concatenated encoder 102 receives from the source a concatenated encoder input block d via a concatenated encoder input port 130, encodes the concatenated encoder input block d (as described below) to generate a concatenated encoder output array x, and transmits x over the channel 104 via a channel input port 134. In response to the transmission of x, the channel 104 produces a concatenated decoder input array y at a channel output port 136. The concatenated decoder 106 receives and decodes y to generate a concatenated decoder output block $\hat{d}$, and passes $\hat{d}$ to the destination via a concatenated decoder output port 144.

Ideally, the communication system 100 is such that the concatenated decoder output block $\hat{d}$ is an exact replica of the concatenated encoder input block d. However, due to imperfections in the system and noise in the channel 104, $\hat{d}$ does not always match d. A frame error is said to occur when $\hat{d} \neq d$, i.e., when $\hat{d}$ differs from d in at least one coordinate. A primary performance criterion for the communication system 100 is the frame error rate (FER), defined as the frequency with which the event $\{\hat{d} \neq d\}$ occurs. The communication system 100 aims to reduce the FER by implementing a forward error correction coding (FEC) scheme, comprising the concatenated encoder 102 and the concatenated decoder 106.

Before turning to the details of the encoding and decoding operations in the communication system 100, it is worth pointing out that, typically, the channel 104 comprises a transmission medium as well as other modules, such as modulators, amplifiers, antennas, digital-to-analog and analog-to-digital convertors, signal acquisition and synchronization circuits, equalizers, etc., that are essential for transmitting and receiving information over the transmission medium but are not directly related to the present principles. It is also worth pointing out that the transmission medium may be a copper cable, an optical cable, or airwaves or some other type of physical medium over which information can be carried by modulating a transmitted signal, wherein the transmitted signal may be, e.g., electrical, optical, or electromagnetic in nature. In some cases, the channel 104 may comprise a data storage device which allows information to be written into at one point in time and read out at a later point in time.

We now turn to the details of the communication system 100 to discuss an embodiment of the present principles where the concatenated code $\mathcal{C}$ is a code over $\mathbb{F}_2 = \{0,1\}$ with dimension K (bits), block length N (bits), and rate R=K/N. The restriction of the concatenated code $\mathcal{C}$ to a code over the binary alphabet $\mathbb{F}_2$ simplifies the presentation of the present principles. However, it will be clear to the person skilled in the art that the present principles can be extended to concatenated codes over non-binary alphabets.

Looking back at FIG. 1, we observe that the concatenated encoder 102 comprises an outer encoder 110 and an inner encoder 112. The concatenated encoder 102 further comprises a concatenated encoder control logic, a concatenated encoder input module, and a concatenated encoder output module, which are not shown in FIG. 1 in order not to clutter the figure with routine detail.

The outer encoder 110 is configured to encode a plurality of outer codes $\mathcal{C}_{out} = (\mathcal{C}_{out,1}, \mathcal{C}_{out,2}, \ldots, \mathcal{C}_{out,m})$, wherein $m \geq 2$ is a number of outer codes, wherein $\mathcal{C}_{out,i}$ is an ith outer code, wherein the ith outer code $\mathcal{C}_{out,i}$ is a code over a finite field $\mathbb{F}_{q_i} = \{0, 1, \ldots, q_i-1\}$, with dimension $K_{out,i}$ (symbols from $\mathbb{F}_{q_i}$), block length $N_{out}$ (symbols from $\mathbb{F}_{q_i}$), and rate $R_{out,i} = K_{out,i}/N_{out}$, wherein $q_i$ is a size of a symbol alphabet $\mathbb{F}_{q_i}$ for the ith outer code $\mathcal{C}_{out,i}$, wherein $q_i$ is a power of two, $q_i = 2^{p_i}$, wherein $p_i$ is a symbol length (in bits) for the ith outer code $\mathcal{C}_{out,i}$, wherein $p_i$ is an integer greater than or equal to 1, wherein the ith outer code dimension $K_{out,i}$ is an integer greater than or equal to 1, and wherein the ith outer code block length $N_{out}$ is an integer greater than or equal to $K_{out,i}$.

While the dimension $K_{out,i}$ of the ith outer code $\mathcal{C}_{out,i}$ may depend on i, the block length $N_{out}$ is common to all outer codes. Measured in bits, the ith outer code $\mathcal{C}_{out,i}$ has dimension $K_{out,i}p_i$ and code block length $N_{out}p_i$. The total number of bits that enter (per encoding cycle) the plurality of outer codes is $\Sigma_{i=1}^m K_{out,i}p_i$, which must be the same as the length of the concatenated encoder input block $d \in \mathbb{F}_2^K$; so, $K = \Sigma_{i=1}^m K_{out,i}p_i$. The total number of bits at the output of the plurality of outer codes equals $N_{out}\Sigma_{i=1}^m p_i$. Thus, the plurality of outer codes $\mathcal{C}_{out}$ has an effective rate $R_{out} \overset{\text{def}}{=} (\Sigma_{i=1}^m K_{out,i}p_i)/(N_{out}\Sigma_{i=1}^m p_i)$.

The inner encoder 112 is configured to encode $N_{out}$ identical copies $\{\mathcal{C}_{in,j}: 1 \leq j \leq N_{out}\}$ of an inner code $\mathcal{C}_{in}$, wherein the inner code $\mathcal{C}_{in}$ is an LPAC code over $\mathbb{F}_2$ characterized by the parameters $(N_{in}, K_{in}, \mathcal{A}, \mathcal{L}_1, \mathcal{L}_2, \ldots, \mathcal{L}_{L=m}, f, g)$, wherein the block length is given by $N_{in} = 2^{n_{in}}$ for some integer $n_{in} \geq 1$, wherein the number of layers is L=m (the same as the number of outer codes), wherein the ith layer index set $\mathcal{L}_i$ has a size $|\mathcal{L}_i| = p_i + r_i$ ($1 \leq i \leq m$), wherein $p_i$ is the symbol length for the ith outer code $\mathcal{C}_{out,i}$ and $r_i$ is a length of an ith layer precoding block ($1 \leq i \leq m$), wherein the impulse response g is a vector $g = (g_0, g_1, \ldots, g_M) \in \mathbb{F}_2^{M+1}$ with $g_0 \neq 0$, $g_M \neq 0$, and $M \geq 1$. Thus, the code $\mathcal{C}_{in,j}$ is a copy the LPAC code $\mathcal{C}_{in}$, and we will refer to $\mathcal{C}_{in,j}$ as the jth inner code.

Figure 2:
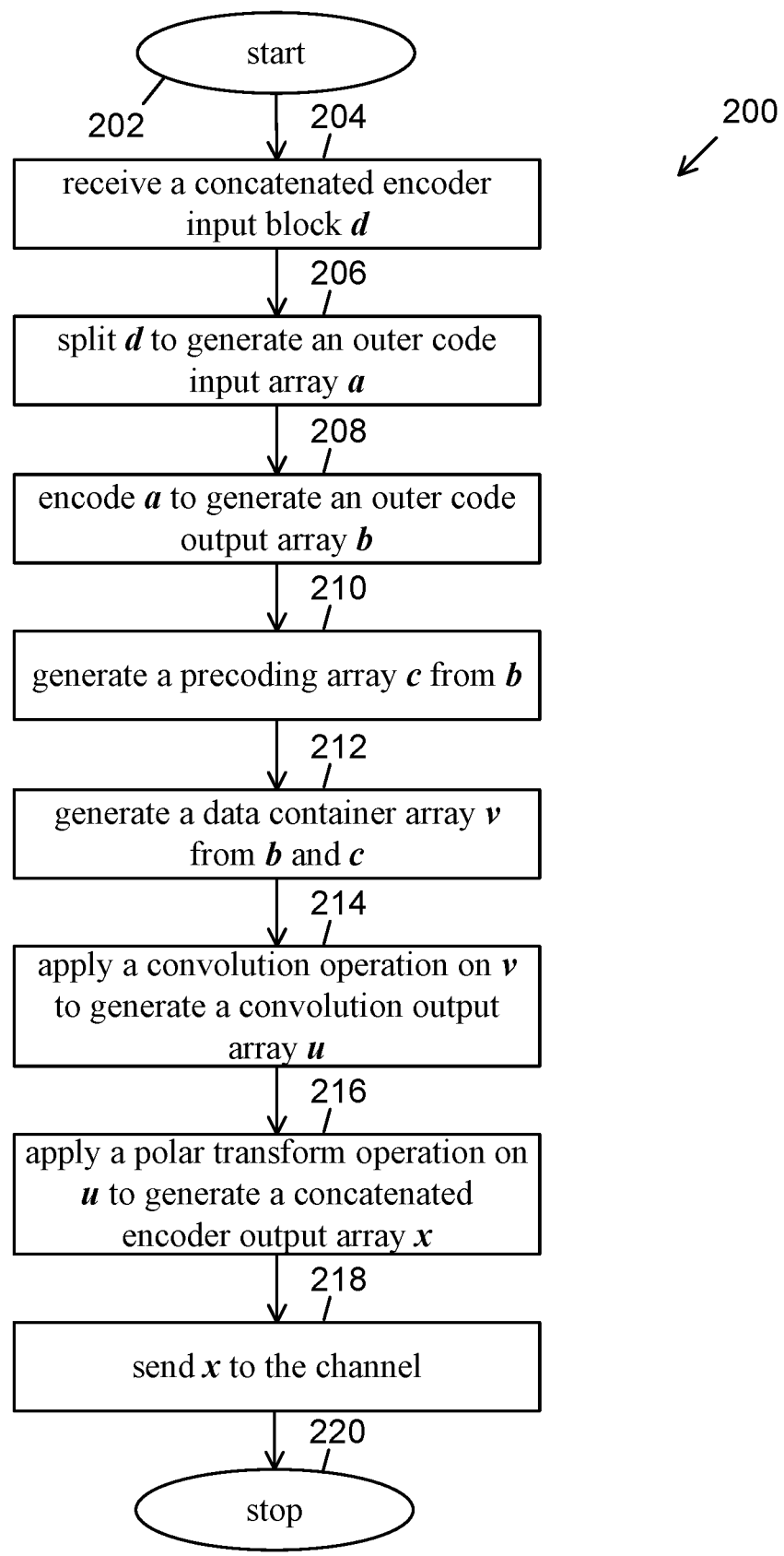
FIG. 2 is a flowchart of a concatenated encoder process according to the present principles.

In order to describe the concatenated encoder 102 in detail, we turn to FIG. 2 which displays a flowchart 200 illustrating the operation of the concatenated encoder 102. Steps 204, 206 and 208 are executed by the outer encoder 110, steps 210, 212, 214, 216, and 218 by the inner encoder 112, steps 202 and 220, as well as the transitions between the steps of the flowchart, are executed by the concatenated encoder control logic.

The concatenated encoder 102 starts operations in step 202 with the concatenated encoder control logic waiting for the concatenated encoder input block d to become available at the concatenated encoder input port 130. When the concatenated encoder input block d becomes available, the concatenated encoder control logic moves to step 204.

In step 204, the outer encoder 110 receives the concatenated encoder input block d at the concatenated encoder input port 130.

In step 206, the outer encoder 110 splits the concatenated encoder input block $d = (d_1, d_2, \ldots, d_K) \in \mathbb{F}_2^K$ into to generate an outer code input array $a \overset{\text{def}}{=} (a_{i,j}: 1 \leq i \leq m; 1 \leq j \leq N_{out})$, wherein $a_{i,j} = (a_{i,j,1}, a_{i,j,2}, \ldots a_{i,j,p_i}) \in \mathbb{F}_{q_i} = \mathbb{F}_2^{p_i}$, and wherein $a_{i,j,k} \in \mathbb{F}_2$. The outer encoder 110 follows a natural order splitting rule, wherein the natural order splitting rule copies the bits of d to the bits of a in the natural order from left to right, namely, $a_{1,1,1} = d_1$, $a_{1,1,2} = d_2$, \ldots, $a_{1,1,p_1} = d_{p_1}$, $a_{1,2,1} = d_{p_1+1}$, $a_{1,2,2} = d_{p_1+2}$, \ldots, $a_{1,2,p_1} = d_{2p_1}$, \ldots, $a_{m,K_{out,m}p_m} = d_K$.

The natural order splitting rule can be expressed compactly by the formula $a_{i,j,k}=d_h$, wherein $h=k+(j-1)p_i+\Sigma_{s=1}^{i-1} K_{out,s}p_s$.

The natural order splitting rule has the advantage of being simple and easy to implement. However, the present principles are compatible with any other splitting rule that assigns the elements of d to the elements of a in any order desired.

In step 208, the outer encoder 110 carries out an outer code encoding operation on the outer code input array a to generate an outer code output array $b \stackrel{\text{def}}{=} (b_{i,j}: 1 \leq i \leq m; 1 \leq j \leq N_{out})$, wherein $b_{i,j}=(b_{i,j,1}, b_{i,j,2}, \ldots, b_{i,j,p_i}) \in \mathbb{F}_{q_i} = \mathbb{F}_2^{p_i}$, and wherein $b_{i,j,k} \in \mathbb{F}_2$.

The outer code encoding operation comprises an ith outer code encoding operation for each integer i in the range $1 \leq i \leq m$, wherein the ith outer code encoding operation comprises encoding an ith outer code input block $a_i$ into an ith outer code output block $b_i$, wherein the ith outer code input block $a_i$ is defined as the ith row of the outer code input array a and wherein the ith outer code output block $b_i$ is defined as the ith row of the outer code output array b. More explicitly, $a_i \stackrel{\text{def}}{=} (a_{i,1}, a_{i,2}, \ldots a_{i,K_{out}})$ and $b_i \stackrel{\text{def}}{=} (b_{i,1}, b_{i,2}, \ldots b_{i,N_{out}})$. Thus, $b_i$ is a codeword corresponding to $a_i$ in $\mathcal{C}_{out,i}$: $b_i = \mathcal{C}_{out,i}(a_i)$. The outer encoder 110 completes step 208 by sending b to the inner encoder 112 via the inner encoder input port 132.

Step 210 is an optional precoding step, which is kipped if no precoding is used. In step 210, the inner encoder 112 generates a precoding array $c \stackrel{\text{def}}{=} (c_{j,i}: 1 \leq j \leq N_{out}; 1 \leq i \leq m)$ from the outer code output array b, wherein $c_{j,i} \in \mathbb{F}_2^{r_i}$. As we will see below, $c_{j,i}$ is carried in the ith layer of the jth inner code $\mathcal{C}_{in,j}$. There are many options in implementing step 210 within the framework of the present principles, as will be discussed in detail below. Here, we admit the most general form of precoding in which one sets $c_{j,i}=h_{j,i}(b)$, wherein $k_i$ can be any function from $b \in \mathbb{F}_2^{m \times N_{out}}$ to $c_{j,i} \in \mathbb{F}_2^{r_i}$. Note that in the special case where $r_i=0$ for each $1 \leq i \leq m$, there is effectively no precoding.

In step 212, the inner encoder 112 generates a data container array $v \stackrel{\text{def}}{=} (v_{j,k}: 1 \leq j \leq N_{out}; 1 \leq k \leq N_{in})$ from the outer code output array b and the precoding array c by setting $v_{j,\mathcal{L}_1}=(b_{1,j}, c_{j,1})$, $v_{j,\mathcal{L}_2}=(b_{2,j}, c_{j,2})$, ..., $v_{j,\mathcal{L}_m}=(b_{m,j}, c_{j,m})$, and $v_{j,\mathcal{A}^c}=f$, wherein $v_{j,k} \in \mathbb{F}_2$, $v_{j,\mathcal{L}_i} \stackrel{\text{def}}{=} (v_{j,k}: k \in \mathcal{L}_i)$, and $v_{j,\mathcal{A}^c} \stackrel{\text{def}}{=} (v_{j,k}: k \in \mathcal{A}^c)$. Note that, by construction, $|\mathcal{L}_i|=p_i+r_i$; hence, $v_{j,\mathcal{L}_i}$ and $(b_{i,j}, c_{j,i})$ have the same size (in terms of the number of bits they may contain), and the assignment $v_{j,\mathcal{L}_i}=(b_{i,j}, c_{j,i})$ is feasible. The present principles can be used with any specific representation of the symbol $b_{i,j} \in \mathbb{F}_{q_i}$ as a sequence of bits $b_{i,j}=(b_{i,j,1}, b_{i,j,2}, \ldots, b_{i,j,p_i}) \in \mathbb{F}_2^{p_i}$ as part of the assignment $v_{j,\mathcal{L}_i}=(b_{i,j}, c_{j,i})$.

In step 214, the inner encoder 112 applies a convolution operation on the data container array v to generate a convolution output array $u \stackrel{\text{def}}{=} (u_{j,k}: 1 \leq j \leq N_{out}; 1 \leq k \leq N_{in})$, wherein $u_{j,k} \in \mathbb{F}_2$, wherein the convolution operation is defined, in terms of the impulse response $g=(g_0, g_1, \ldots, g_M) \in \mathbb{F}_2^{M+1}$ of the LPAC code $\mathcal{C}_{in}$, by the formula $u_{j,i}=\Sigma_{k=0}^M g_k v_{j,i-k}$, wherein the sum is over $\mathbb{F}_2$, and wherein $v_{j,i-k}$ is interpreted as 0 if $i-k \leq 0$.

In step 216, the inner encoder 112 applies a polar transform operation on the convolution output array u to generate the concatenated encoder output array x, wherein the concatenated encoder output array has a form $x \stackrel{\text{def}}{=} (x_{j,k}: 1 \leq j \leq N_{out}; 1 \leq k \leq N_{in})$, wherein $x_{j,k} \in \mathbb{F}_2$. In preferred embodiments of the present principles, the concatenated encoder output array is computed row-by-row by carrying out a polar transform operation $x_j = u_j F^{\otimes n_{in}}$, wherein $$F = \begin{bmatrix} 1 & 0 \\ 1 & 1 \end{bmatrix},$$

$F^{\otimes n_{in}}$ is the $(n_{in})$th Kronecker power of F, $n_{in}=\log_2 N_{in}$ wherein $x_j \stackrel{\text{def}}{=} (x_{k,k}: 1 \leq k \leq N_{in})$ is a jth row of x, and wherein $u_j \stackrel{\text{def}}{=} (u_{j,k}: 1 \leq k \leq N_{in})$ is a jth row of u.

In step 218, inner encoder 112 sends the concatenated encoder output array x to the channel 104 via the channel input port 134. (Modulation and demodulation operations are regarded as part of the channel 104.)

In step 220, the concatenated encoder 102 enters a stop state. In case there is continuous encoding of data, step 220 may be eliminated and step 218 may be followed directly by step 202.

This completes the description of the concatenated encoder 102. Several remarks are in order before describing the concatenated decoder 106.

In the embodiment of the inner encoder 112 described above, the inner encoding mapping $b \rightarrow x$ decouples into $N_{out}$ independent mappings $b^j \rightarrow x_j$ for $j=1, \ldots, N_{out}$, wherein $b^j \stackrel{\text{def}}{=} (b_{i,j}: 1 \leq i \leq m)$ is the jth column of the outer encoder output array b. Hence, the inner encoding steps 210 through 216 can be carried out independently. One option is to implement each mapping $b^j \rightarrow x_j$ in parallel by using dedicated hardware or software resources when speed is important. Alternatively, a single hardware or software may carry out the mappings $b^j \rightarrow x_j$ sequentially if cost of implementation is important. The present principles offer a rich set of implementation options for the inner decoder 112, from fully-parallel to semi-parallel to fully-serial implementation, which can be used to trade hardware cost for throughput. On the other hand, the scope of the present principles is not limited by inner encoder mappings $b \rightarrow x$ that decouple into $N_{out}$ independent mappings $b^j \rightarrow x_j$; the specific mapping given in connection with FIG. 2 is for illustration only. The person skilled in the art will be able to devise many other inner encoding mappings that can be with used without departing from the essential features of the present principles.

Step 210 admits any precoding rule of the form $c_{j,i}=h_{j,i}(b)$. An alternative is to use a "local" precoding function $c_{j,i}=h_i(b^j)$ so that $c_j$ depends only on $b^j$. A second alternative is to use a "local and causal" precoding function $c_{j,i}=h_i(b_{1,j}, b_{2,j}, \ldots, b_{i,j})$. It is also possible to set $r_i=0$ for $i=1, 2, \ldots, m-1$ and allow only $r_m$ to be nonzero.

A local and causal precoding function has the advantage of allowing inner decoders to prune their search trees by detecting precoding violations as they carry out decoding. On the other hand, the general precoding rule $c_{j,i}=h_{j,i}(b)$, admits precoding across the inner code input array and has the potential to detect errors more efficiently (hence improve the coding gain of the overall concatenated code). In the rest of the description, we will assume that a local and causal precoding function is used.

In general, it is advantageous to be able to detect errors as part of inner decoding and mark them as erasures since erasures offer a lesser challenge to the outer decoder 116 compared to undetected errors. On the other hand, error detection by precoding increases coding overhead, especially if the number of bits in the precoding block is significant compared to the inner code block length $N_{in}$. The precoding overhead can be quantified by the precoding rate $R_{pre}=(\Sigma_{i=1}^{m} p_i)/(\Sigma_{i=1}^{m}(p_i+r_i))$, which is the ratio of the number of bits before and after precoding. Optimizing the rate of precoding is a critical aspect of successful application of the present principles.

From the description of the inner encoder 112, it is seen that the concatenated encoder 102 receives $K=\Sigma_{i=1}^{m} K_{out,i}p_i$ bits and sends out $N=N_{out}N_{in}$ bits. So, the concatenated code $\mathcal{C}$ has a rate $R=(\Sigma_{i=1}^{m} K_{out,i}p_1)/N_{out}N_{in}$. This rate can be written as a product $R=R_{out}R_{in}$, where $R_{out}=(\Sigma_{i=1}^{m} K_{out,i}p_i)/(N_{out}\Sigma_{i=1}^{m} p_i)$ is the rate of (the code generated by) the outer encoder 110 and $R_{in}=(\Sigma_{i=1}^{m} p_i)/N_{in}$ is the rate (of the code generated by) the inner encoder 112. Note that $R_{in}$ equals the product of the precoding rate $R_{pre}=(\Sigma_{i=1}^{m} p_i)/(\Sigma_{i=1}^{m} (p_i+r_i))$ and the LPAC code rate $R_{lpac}=(\Sigma_{i=1}^{m}(p_i+r_i))/N_{in}$. Hence, the rate of the concatenated code $\mathcal{C}$ factors into a product of three rates $R=R_{out}R_{pre}R_{lpac}$.

We now look back at FIG. 1 and discuss the channel 104 in some more detail. In response to the transmission of the concatenated encoder output array x, the channel 104 produces the concatenated decoder input array $y \stackrel{\text{def}}{=} (y_{j,k}: 1 \leq j \leq N_{out}; 1 \leq k \leq N_{in})$, wherein $y_{j,k} \in \mathbb{F}_2$. According to the model here, the channel 104 produces $y_{j,k}$ in response to the transmission of $x_{j,k}$, and ideally, $y_{j,k}=X_{j,k}$; however, typically, $y_{j,k}$ is a corrupted version of $X_{j,k}$ due to noise and other imperfections in the channel 104, and the relation between $y_{j,k}$ and $X_{j,k}$ is described by a probabilistic model.

The present principles use a probabilistic model of the communication channel 104, wherein the probabilistic model is characterized by a channel transition probability assignment W(y|x), wherein C(y|x) is the conditional probability (or probability density) that the channel 104 produces the concatenated decoder input array y at the channel output port 136 given that the concatenated encoder output array x is transmitted at the channel input port 134. The present principles are most effectively applicable if the channel 104 conforms to a memoryless probabilistic model so that the channel transition probability assignment has a product form $W(y|x)=\Pi_{j=1}^{N_{out}}\Pi_{k=1}^{N_{in}}W(y_{j,k}|x_{j,k})$.

While still looking at FIG. 1, we observe that the concatenated decoder 106 comprises an inner decoder 114, an outer decoder 116, and a reencoder 118. The concatenated decoder 106 further comprises a concatenated decoder control logic, which is not shown in FIG. 1 in order not to clutter the figure with routine detail.

The concatenated decoder 106 carries out a layered decoding operation on the concatenated code $\mathcal{C}$, wherein the layered decoding operation comprises an ith layer decoding operation, wherein i is an integer in the range $1 \leq i \leq m$, wherein m is the number of layers, wherein the ith layer decoding operation comprises an ith layer inner decoding operation, an ith layer outer decoding operation, and an ith layer reencoding operation, wherein the ith layer inner decoding operation is carried out by the inner decoder 114, wherein ith layer outer decoding operation is carried out by the outer decoder 116.

Figure 3:
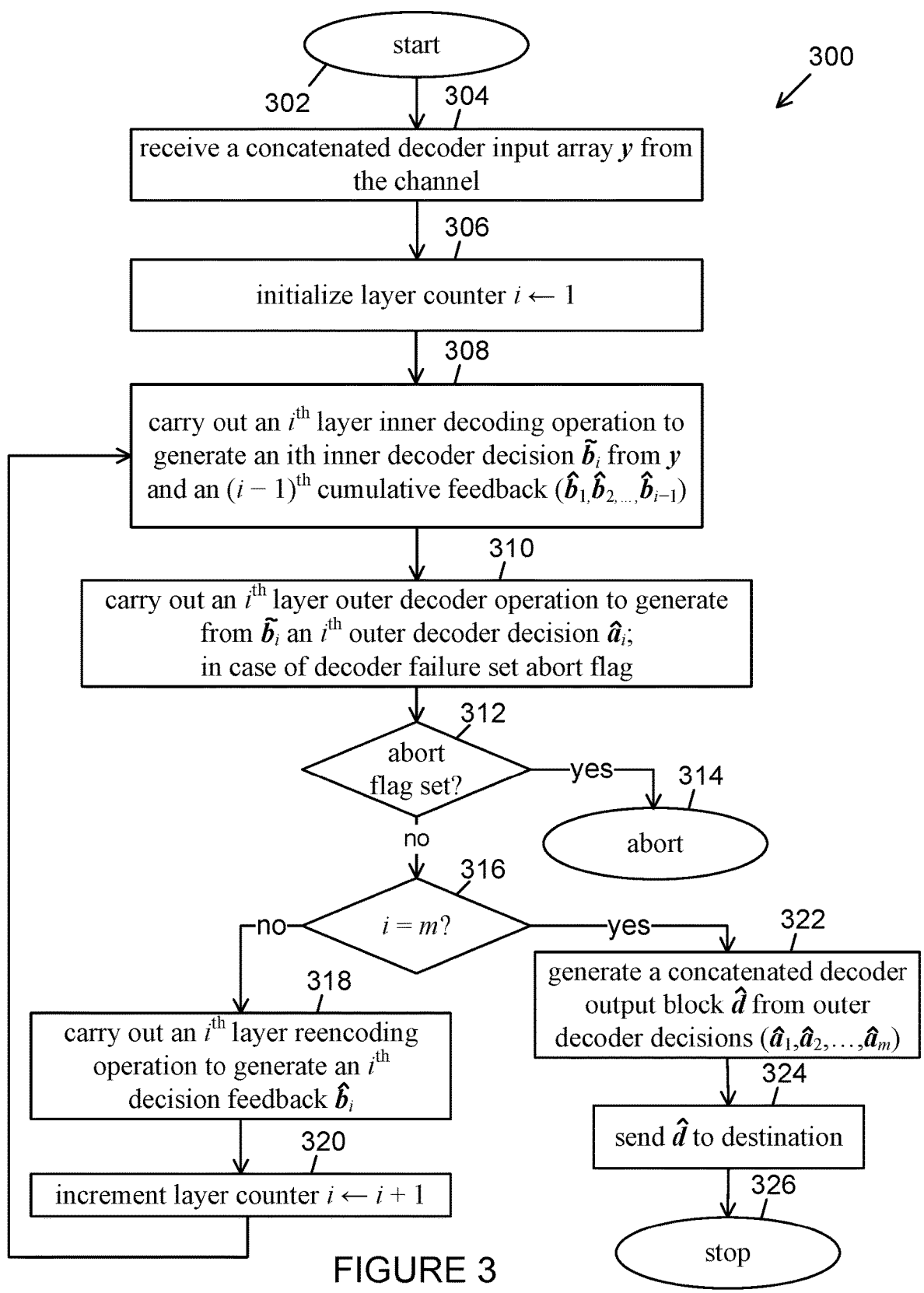
FIG. 3 is a flowchart of a concatenated decoder process according to the present principles.

For details of the layered decoding operation, we turn to FIG. 3, which is a flowchart 300 illustrating an embodiment of the concatenated decoder 106. We will assume that a local and causal precoding function of the form $c_{j,i}=h_i(b_{1,j}, b_{2,j}, \ldots, b_{i,j})$ is used.

The concatenated decoder 106 begins operations in step 302, with the concatenated decoder 106 in a start state, waiting for the concatenated decoder input array y to become available at the channel output port 136. When y becomes available, the concatenated decoder 106 moves to step 304 and receives y from the channel output port 136.

In step 306, the concatenated decoder 106 initializes a layer counter to i=1. The task of the layer counter is to keep track of a layer of concatenated code that is currently being decoded.

In step 308, with the layer counter value set to i, the inner decoder 114 receives y from the channel, receives an (i−1)th decision feedback $\hat{b}_{i-1}$ from the reencoder 118, and decodes y using an (i−1)th cumulative decision feedback $(\hat{b}_1, \hat{b}_2, \ldots, \hat{b}_{i-1})$ to generate an ith inner decoder decision $\tilde{b}_i \stackrel{\text{def}}{=} (\tilde{b}_{i,1}, \tilde{b}_{i,2}, \ldots, \tilde{b}_{i,N_{out}})$, wherein $\hat{b}_k$, for k=1, ..., i−2, are is a kth decision feedback produced by the reencoder 118 in a kth layer reencoding operation, and wherein $\tilde{b}_i$ is an estimate of the ith outer code output block $b_i$. Note that in the first layer of concatenated decoding, with i=1, the (i−1)th cumulative decision feedback $(\hat{b}_1, \hat{b}_2, \ldots, \hat{b}_{i-1})$ is null; so, the inner decoder 114 can carry out the first layer of decoding using only y. Note also that, ideally, the ith inner decoder decision $\tilde{b}_i$ equals the ith outer code output block $b_i$, but due to noise in the channel 104 and other imperfections, occasionally, $\tilde{b}_i$ and $b_i$ will differ. When $\tilde{b}_i$ fails match $b_i$, the present principles rely on the ith outer code $\mathcal{C}_{out,i}$ to correct the errors in $\tilde{b}_i$ and supply an ith decision feedback $\hat{b}_i$ that matches $b_i$. Accordingly, the ith decision feedback $\hat{b}_i$ has a form that matches the form of $b_i$, namely, $\hat{b}_i=(\hat{b}_{i,1}, \hat{b}_{i,1}, \ldots, \hat{b}_{i,N_{out}})$, wherein $\hat{b}_{i,j}=(\hat{b}_{i,j,1}, \hat{b}_{i,j,2}, \ldots \hat{b}_{i,j,p_i}) \in \mathbb{F}_{q^i}= \mathbb{F}_{2^{p_i}}$, and wherein $\hat{b}_{i,j,k} \in \mathbb{F}_2$.

Further details of inner decoder 114 are as follows. In step 308, with the layer counter value set to i, the inner decoder 114 executes, for each j=1, 2, . . . ,$N_{out}$, an ith layer inner decoding operation on a code $\mathcal{C}_{in,j,i}$, wherein $\mathcal{C}_{in,j,i}$ is a PAC code over $\mathbb{F}_2$ with parameters $(N_{in}, K_{in,j,i} \stackrel{\text{def}}{=} K_{in} - \Sigma_{k=1}^{i-1}|\mathcal{L}_k|, \mathcal{A}_i \stackrel{\text{def}}{=} \mathcal{A} \setminus \bigcup_{k=1}^{i-1} \mathcal{L}_k, f_{j,i}, g)$, wherein the frozen block $f_{j,i}$ is given by $f_{j,i}= \alpha_{\mathcal{A}_i^c}$, wherein $\alpha \in \mathbb{F}_2^{N_{in}}$ is such that $\alpha_{\mathcal{A}^c}=f$ and $\alpha_{\mathcal{L}_k}=(\hat{b}_{k,j}, \hat{c}_{j,k})$ for $1 \leq k \leq i-1$, wherein $\hat{c}_{j,k}=h_k (\hat{b}_{1,j}, \hat{b}_{2,j}, \ldots, \hat{b}_{k,j})$. Note that the causal nature of the precoding function is indispensable for implementing this step of the inner decoding operation.

For each $1 \leq j \leq N_{out}$, the ith layer inner decoding operation on the inner code $\mathcal{C}_{in,j,i}$ comprises generating $\tilde{b}_{i,j}$ using $y^j$, $(\hat{b}_{1,j}, \hat{b}_{2,j}, \ldots, \hat{b}_{i-1,j})$, and $(\hat{c}_{1,j}, \hat{c}_{2,j}, \ldots, \hat{c}_{i-1,j})$, wherein $y_j \stackrel{\text{def}}{=} y_{j,k}: 1 \leq k \leq N_{in})$ is the jth row of y. In preferred embodiments of the present principles, the inner decoder 114 generates $\tilde{b}_{i,j}$ using a tree-search algorithm, such as a sequential decoder, as discussed below. When $\tilde{b}_{i,j}$ is ready for each $1 \leq j \leq N_{out}$, the inner decoder 114 completes step 308 by sending the ith inner decoder decision $\tilde{b}_i$ to the outer decoder 116.

Typically, the decision $\tilde{b}_{i,j}$ is a symbol from the same symbol alphabet as $b_{i,j}$. However, in some embodiments of the present principles, the inner decoder 114 may mark $\tilde{b}_{i,j}$ as an erasure, e.g., when the inner decoder 114 fails to produce a $\tilde{b}_{i,j}$ that is consistent with the precoding blocks $\hat{c}_{j,k}$, or when the inner decoder is equipped with a computational time-out limit and cannot complete decoding within the computational time-out limit.

In carrying out the ith layer inner decoding operation on the inner code $\mathcal{C}_{in,j,i}$, the inner decoder 114 treats $(\hat{b}_{1,j}, \hat{b}_{2,j}, \ldots, \hat{b}_{i-1,j})$ as a correct estimate of $(b_{1,j}, b_{2,j}, \ldots, b_{i-1,j})$. If the decision feedback is not correct, the concatenated decoder 106 will never recover from such an error. In other words, the inner decoder 114 is not capable of correcting errors in the decision feedback. However, the outer decoder 116 will typically correct errors in the decision $\tilde{b}_{i,j}$. If the number of errors, namely, the number indices j for which $\tilde{b}_{i,j} \neq b_{i,j}$, is small enough, the outer decoder 116 will be able to correct the errors and obtain a final decision $\hat{b}_{i,j}$ such that $\hat{b}_{i,j} = b_{i,j}$. We now turn to the details of the outer decoder 116.

In step 310, with the layer counter value set to i, the outer decoder 116 executes an ith layer outer decoding operation on the ith outer code $\mathcal{C}_{out,i}$. The outer decoder 116 receives the ith inner decoder decision $\tilde{b}_i$ from the inner decoder 114 at the outer decoder input port 138 and generates an ith outer decoder decision $\hat{a}_i$. Ideally, $\hat{a}_i$ is an exact copy of the ith row $a_i$ of the outer decoder input array a. Sometimes the ith layer outer decoding operation may result in a decoding failure, e.g., when a bounded distance decoder is employed and the number of errors and/or erasures exceeds a certain threshold. When the outer decoder 116 detects a decoding failure, it sets an abort flag. In the absence of a decoding failure, the ith outer decoder decision $\hat{a}_i$ has the form $\hat{a}_i \stackrel{\text{def}}{=} (\hat{a}_{i,1}, \hat{a}_{i,2}, \ldots, \hat{a}_{i,K_{out,i}})$, wherein $\hat{a}_{i,j} = (\hat{a}_{i,j,1}, \hat{a}_{i,j,2}, \ldots \hat{a}_{i,j,p_i}) \in \mathbb{F}_{q_i} = \mathbb{F}_2^{p_i}$, wherein $\hat{a}_{i,j,k} \in \mathbb{F}_2$, and wherein $K_{out,i}$ is the dimension of the ith outer code $\mathcal{C}_{out,i}$ and $p_i$ is the symbol length (in bits) for the ith outer code $\mathcal{C}_{out,i}$. Ideally, we have $\bar{a}_{i,j,k} = a_{i,j,k}$ for all i,j,k, wherein $a_{i,j,k}$ is the kth bit of the element $a_{i,j} = (a_{i,j,1}, a_{i,j,2}, \ldots a_{i,j,p_i})$ in the outer code input array $a = (a_{i,j}: 1 \leq i \leq m; 1 \leq j \leq N_{out})$, as defined earlier.

In step 312, the concatenated decoder 106 checks if the abort flag is set; if the abort flag is set, decoding is aborted by executing step 314. Following an abort operation, the concatenated decoder 106 may move from step 314 to step 302 to start a new decoding cycle.

In step is 316, the concatenated decoder 106 checks if the mth (final) layer of decoding is completed. If the result is yes, a termination procedure is executed by entering step 322 (described below); if the check result is no, decoding continues with step 318.

In step 318, with the layer counter value set to i, the reencoder 118 carries out an ith layer reencoding operation, wherein the ith layer reencoding operation comprises encoding the ith outer decoder decision $\hat{a}_i$ to generate an ith decision feedback $\hat{b}_i$ and sending $\hat{b}_i$ to the inner decoder 114 via the inner decoder input port 142, wherein the ith decision feedback $\hat{b}_i$ is the codeword $\hat{b}_i = \mathcal{C}_{out,i}(\hat{a}_i)$ in the ith outer code $\mathcal{C}_{out,i}$ corresponding to the ith outer decoder decision $\hat{a}_i$. Thus, the ith layer reencoding operation is identical to the ith layer outer encoding operation $b_i = \mathcal{C}_{out,i}(a_i)$ carried out by the outer encoder 110.

In step 320, the concatenated decoder 106 increments the value of the layer counter i by 1 and proceeds to step 308 to initiate the decoding of the next layer.

In step 322, the outer decoder 116 generates the concatenated decoder output block $\hat{d} = (\hat{d}_1, \hat{d}_2, \ldots, \hat{d}_K) \in \mathbb{F}_2^K$ from $(\hat{a}_1, \hat{a}_2, \ldots, \hat{a}_m)$ by setting $\hat{d}_h = \hat{a}_{ijk}$ where $h = k + (j-1)p_i + \Sigma_{s=1}^{i-1} K_{out,s} p_s$ for $i = 1, \ldots, m, j = 1, \ldots, K_{out,i}, s = 1, \ldots, p_i$, wherein $\hat{a}_{ijk}$ is as defined above in connection with step 310. This operation in step 322 is the inverse of the operation in step 210 of FIG. 2.

In step 324, the outer decoder 116 sends the concatenated decoder output block $\hat{d}$ over the concatenated decoder output port 144 to the destination.

In step 326, the concatenated decoder 106 completes the layered decoding operation by entering a stop state. In some embodiments of the present principles in which one layered decoding operation is followed by another, step 326 may be eliminated and step 324 followed immediately by step 302 to initiate a new round of decoding.

This completes the description of the concatenated decoder 106. This also completes the discussion of the basic form of the present principles. We now turn to a most preferred embodiment of the present principles.

A most preferred design methodology. Here we present a most preferred method for designing a concatenated code $\mathcal{C}$ in accordance with the present principles. We will assume that the primary design goal is to find a concatenated code C that meets a target rate R and a target FER $P(\hat{d} \neq d)$. Consider an initial design for which that meets the target rate R. Below we show how to estimate the FER $(\hat{d} \neq d)$ for such a design.

The first task is to estimate $\epsilon_{i,j} \stackrel{\text{def}}{=} P(\tilde{b}_{i,j} \neq b_{i,j})$, $\delta_{i,j} \stackrel{\text{def}}{=} P(\tilde{b}_{i,j} = e)$, and $v_{i,j} \stackrel{\text{def}}{=} \epsilon_{i,j} - \delta_{i,j}$, wherein $\epsilon_{i,j}$ is an ith layer symbol error rate for the inner code $\mathcal{C}_{in,j,i}$, wherein $\delta_{i,j}$ is an ith layer symbol erasure rate for the inner code $\mathcal{C}_{in,j,i}$, wherein $v_{i,j}$ is an ith layer undetected symbol error rate for the ith inner code $\mathcal{C}_{in,j,i}$, wherein e denotes an erasure symbol, wherein the erasure symbol e can be any symbol which is not a member of the ith outer code symbol alphabet $\mathbb{F}_{q_i}$, wherein the ith layer symbol error rate $\epsilon_{i,j}$ and the ith layer symbol erasure rate $\epsilon_{i,j}$ are measured assuming that the decoder is fed the correct symbol values $\{b_{k,j}: 1 \leq k \leq i-1\}$ by a genie. It will be known to the person skilled in the art that such genie-aided analysis of error performance is common in the design of polar codes and here the same type of design method is employed.

Once the probabilities $v_{i,j}$ and $\delta_{i,j}$ are estimated for all i and j, the next step is to estimate the FER $P(\hat{a}_i \neq a_i)$ for the ith outer code $\mathcal{C}_{out,i}$ for each i. Here, we use the bound $P(\hat{a}_i \neq a_i) \leq \phi_i$, wherein $\phi_i$ is the probability of the event that $\{2t + s \geq d_{out,i}\}$, wherein $d_{out,i}$ is the minimum distance of the ith outer code $\mathcal{C}_{out,i}$ and wherein t and s are, respectively, the number of undetected symbol errors and symbol erasures at the output of the plurality of ith layer inner codes $\{\mathcal{C}_{in,j,i}: 1 \leq j \leq N_{out}\}$. It is straightforward to compute $\phi P_i$; in particular, if the parameters $\epsilon_{i,j}$, $\delta_{i,j}$, and $v_{i,j}$ do not depend on the inner code index j, then the person skilled in the art will know that $\phi_i$ can be calculated as $$\phi_i = \sum_{2t+s \geq d_{out,i}} \binom{N_{out}}{t} \binom{N_{out} - t}{s} v_i^t \delta_i^s (1 - v_i - \delta_i)^{N_{out} - t - s}$$

wherein the sum is over all pairs of non-negative integers t and s that satisfy $2t + s \geq d_{out,i}$.

Once $\phi_i$ are calculated by the above formula or estimated in some other manner, one uses the union bound $P(\hat{d} \neq d) \leq \Sigma_{i=1}^m \phi_i$ to obtain an upper bound on the FER $P(\hat{d} \neq d)$ for the concatenated code C. If the design goal on the FER $P(\hat{d} \neq d)$ is not met, one tries a new set of parameters. Finding a feasible design and improving it involves a considerable amount a search over the parameter spaces of the inner and outer codes.

The most preferred embodiment. In the most preferred embodiment of the present principles, the ith outer code $\mathcal{C}_{out,i}$ is a Reed-Solomon code over the field $\mathbb{F}_{q_i}$, with $q_i = 2^{p_i}$, $1 \leq i \leq m$, wherein the Reed-Solomon code may be a regular Reed-Solomon code with block length $N_{out,i} = 2^{q_i} - 1$, or a shortened Reed-Solomon code with block length $N_{out,i} < 2^{q_i}-1$, or an extended Reed-Solomon code with block length $N_{out,i} = 2^{q_i}$.

Reed-Solomon codes are minimum distance separable, so the ith outer code in the most preferred embodiment has a minimum distance $d_{out,i} \stackrel{\text{def}}{=} N_{out,i} - K_{out,i} + 1$. The ith outer code $\mathcal{C}_{out,i}$ is decoded using a bounded distance decoder (such as the Berlekamp-Massey algorithm), which is capable of correcting any combination of t errors and s erasures provided that $2t+s < d_{out,i}$.

The inner code in the most preferred embodiment of the present principles is an LPAC code with as many layers as the number of outer codes. The most preferred method for selection of the plurality of data layer index sets is the reliability score function method.

Optionally, the inner encoder 112 employs precoding for error detection at the decoder. If the precoding option is used, the most preferred method of precoding is to use a cyclic redundancy check (CRC), which is a type of error detection method with low-complexity encoding and error-detection circuitry.

In the most preferred embodiment, the inner decoder 114 employs a sequential decoding algorithm. If the precoding option is employed by the inner encoder 112, then the inner decoder employs error detection and outputs erasure symbols when an error is detected.

In the most preferred embodiment, optionally, the sequential decoder employed by the inner decoder 114 is equipped with a time-out rule to curb excessive computation, wherein the time-out rule keeps a count of the number of times the sequential decoder visits a certain subset of nodes $\mathcal{S}$ in the code tree and stops (aborts) decoding if the count exceeds a certain prescribed limit $V_{max}$. For example, $\mathcal{S}$ may be the set of all nodes in the code tree or the set of all nodes at a certain level i in the code tree. It is possible to apply several time-out rules concurrently. If the stack algorithm is used as a sequential decoder, the number of visits to nodes in $\mathcal{S}$ is well-defined since the stack algorithm cannot visit any node more than once. On the other hand, the Fano algorithm may visit a node multiple times (with different "threshold" values). For Fano algorithm, an alternative method of implementing the time-out rule is to count only the first visits to nodes in the set $\mathcal{S}$.

Examples. Below we present four examples of the most preferred embodiment of the present principles. The goal in giving these examples is to illustrate the practical utility of the present principles, in particular, the utility of LPAC codes as an effective inner coding method in GCC/MLC schemes. The examples also aim to illustrate that the pre-coding and computational time-out methods are effective components of the present principles for performance enhancement and decoder complexity reduction. We will first describe the common features of all four examples.

All examples show concatenated codes $\mathcal{C}$ that were designed to meet a target data rate R=0.75 and a target FER $10^{-15}$. All concatenated codes C in the examples have the same block lengths $N_{out}=256$, $N_{in}=128$, and $N=N_{out}N_{in}=32,768$; this makes a fair comparison between different designs possible.

The channel in the examples is a binary-input additive Gaussian noise (BI-AWGN) channel, with a product-form channel transition density function $W(y|x) = \prod_{j=1}^{N_{out}} \prod_{k=1}^{N_{in}} W(y_{j,k}|x_{j,k})$, wherein $$W(y_{j,k}|x_{j,k}) = \frac{1}{\sqrt{2\pi\sigma^2}} e^{\frac{(y_{j,k}-s_{j,k})^2}{2\sigma^2}},$$

wherein $s_{j,k}=1$ if $x_{j,k}=0$ and $s_{j,k}=-1$ if $x_{j,k}=1$. The channel is operated at a signal-to-noise ratio (SNR) of 5.5 decibels (dB), where the SNR (in dB) is defined as $\text{SNR} \stackrel{\text{def}}{=} 10 \log_{10}(1/\sigma^2)$. Thus, 5.5 dB SNR corresponds to $\sigma^2=3.55$. (The BI-AWGN channel described here is a model for Binary Phase Shift Keying (BPSK) modulation.)

In the examples, the outer codes $\{\mathcal{C}_{out,i}: 1 \le i \le m\}$ are extended Reed-Solomon codes over $\mathbb{F}_{q=256}$ with a block length $N_{out}=256$. The number of outer codes m is fixed as and the dimensions $\{K_{out,i}\}$ of the outer codes $\{\mathcal{C}_{out,i}\}$ are left as free design parameters. The ith outer code $\mathcal{C}_{out,i}$ is decoded using a bounded distance decoder, which is capable of correcting any combination of t errors and s erasures provided that $2t+s < d_{out,i}$, wherein $d_{out,i} \stackrel{\text{def}}{=} N_{out,i} - K_{out,i} + 1$.

The inner code $\mathcal{C}_{in}$ in the examples is a LPAC code over $\mathbb{F}_2$ with block length $N_{in}=128$, $K_{in}=104$, m=13 layers, impulse response g=(1, 0, 1, 1, 0, 1, 1), and frozen block f=0. The data index set $\mathcal{A}$ and the layer index sets $\{\mathcal{L}_i\}$ of the inner code $\mathcal{C}_{in}$ are selected using the reliability score function, where the reliabilities are calculated by the density-evolution method for the BI-AWGN channel at an operating SNR of 5.5 dB. The layer index sets in all four examples are as follows: $\mathcal{L}_1=\{14, 15, 20, 41, 49, 67, 69, 73\}$, $\mathcal{L}_2=\{22, 23, 26, 27, 36, 38, 81, 97\}$, $\mathcal{L}_3=\{29, 39, 42, 43, 45, 50, 68, 70\}$, $\mathcal{L}_4=\{16, 51, 53, 71, 74, 75, 77, 82\}$, $\mathcal{L}_5=\{24, 28, 57, 83, 85, 89, 98, 99\}$, $\mathcal{L}_6=\{30, 31, 40, 44, 46, 101, 105, 113\}$, $\mathcal{L}_7=\{47, 52, 54, 55, 58, 72, 76, 78\}$, $\mathcal{L}_8=\{59, 61, 79, 84, 86, 87, 90, 100\}$, $\mathcal{L}_9=\{91, 93, 102, 103, 106, 107, 109, 114\}$, $\mathcal{L}_{10}=\{32, 48, 56, 60, 80, 115, 117, 121\}$, $\mathcal{L}_{11}=\{62, 63, 88, 92, 94, 95, 104, 108\}$, $\mathcal{L}_{12}=\{110, 111, 116, 118, 119, 122, 123, 125\}$, $\mathcal{L}_{13}=\{64, 96, 112, 120, 124, 126, 127, 128\}$.

The inner decoder in the examples is a Fano sequential decoder. In all examples below, a time-out rule is applied with a bound $V_{max}$ on the number of visits to all nodes in the code tree and where each visit to each node is counted (not just the first visits).

The design methodology in the examples involves simulations to estimate symbol error probability $\upsilon_{i,j}$ and the symbol erasure probability $\delta_{i,j}$ at the output of the inner code $\mathcal{C}_{in,j,i}$. Here, the parameters $\upsilon_{i,j}$ and $\delta_{i,j}$ do not depend on the index j due to symmetry in the BI-AWGN channel and BPSK modulation, hence, we simplify the notation and write $\upsilon_i$ and $\delta_i$ instead of $\upsilon_{i,j}$ and $\delta_{i,j}$.

To estimate the undetected symbol error rate $\upsilon_i$ and the estimated symbol erasure rate $\delta_i$, simulations were carried out until two hundred undetected symbol errors or symbols erasures were observed, or until the number of trials reached one million. In some cases, the probabilities $\upsilon_i$ and $\delta_i$ are too small to be estimated by simulation in practice. In such cases, we used conservative upper bounds based on density estimation method to estimate $\upsilon_i$ and $\delta_i$. Once the probabilities $\upsilon_i$ and $\delta_i$ are estimated for all i, we chose the dimensions $K_{out,i}$ so that $\Sigma_{i=1}^{m} \phi_i$ is smaller than the target FER, where $\phi_i \stackrel{\text{def}}{=} P(\hat{a}_i \ne a_i)$ is the FER for the ith outer code $\mathcal{C}_{out,i}$. We calculated $\phi_i$ using the formula given above.

Example 1. In the first example, the inner code is a LPAC code with block-length $N_{in}=128$, dimension $K_{in}=104$, and number of layers $m=13$. The plurality of outer codes $\{C_{out,i}: 1 \le i \le m\}$ are extended Reed-Solomon codes over $\mathbb{F}_q=256$ with block length $N_{out}=256$ and dimensions $\{K_{out,i}: 1 \le i \le m\}$ as listed in the second column of Table 1. (For i=12, 13, the ith outer code $C_{out,i}$ has rate 1; in other words, layers 13, 14 are not protected by an outer code. So, it is actually possible to combine the layers 12, 13, 14 into a single layer, and view the combined layer as a single layer with a symbol length 8+8=16 bits.)

The symbol lengths for the outer codes are $p_i=8$, as shown in the third column of Table 1. There is no precoding in this example, so the precoding block lengths $r_i$ are set to 0 as also shown in the third column of Table 1.

The inner decoder is a sequential decoder with a time-out limit $V_{max}=5,000 \cdot N_{in}=640,000$ on the number of visits to all nodes in the code tree. The fourth column of Table 1 shows $V_{ave}/N_{in}$, where $V_{ave}$ is the average, over all simulation runs, of number of nodes visited in the code tree. (Each visit to each node is counted without exception, not just the first visits.) We observe that the mean computation is far from $$\frac{V_{max}}{N_{in}} = 5000.$$

The fifth and sixth columns of Table 1 show the estimated undetected symbol error rate $\upsilon_i$ and the estimated symbol erasure rate $\delta_i$ for each layer $1 \le i \le 13$. Since there is no precoding in this example, error-detection by mean of precoding is not possible. However, erasures could still occur because of the time-out limit $V_{max}$. The fact that $\delta_i=0$ at all layers is an indication that $V_{max}=640,000$ is a loose bound on computational complexity.

For layers seven to thirteen, one million trials simulation produced no undetected errors or erasures; so, we used a conservative analytical upper bound as mentioned above. Those analytical estimates are marked with a "*" in the sixth column of Table 1.

The FER values $\phi_i$ in the seventh column of Table 1 were obtained by the formula given above. The sum $\Sigma_{i=1}^{m=13} \phi_i$ equals $1.32 \cdot 10^{-16}$, which shows that the FER for the concatenated code in this example satisfies the target FER $10^{-15}$.

As for the code rate, the final concatenated code has dimension $K=\Sigma_{i=1}^{13} K_{out,i} p_i=24,560$, code block length $N=N_{out}N_{in}=32,768$, and rate $R=K/N=0.750$. The Shannon limit on the minimum required SNR for achieving a data rate of $R=0.750$ on the BI-AWGN channel (allowing arbitrarily large block lengths) is 3.381 dB; thus, the gap to Shannon limit for the concatenated code in this example is around 2.119 dB.

TABLE 1

Parameters for the first example of the most preferred embodiment.

| Layer index i | $K_{out,i}$ | $(p_i, r_i)$ | $V_{ave}/N_{in}$ | $\upsilon_i$ | $\delta_i$ | $\phi_i$ |
|---|---|---|---|---|---|---|
| 1 | 122 | (8, 0) | 2.38 | 8.68E−02 | 0 | 2.02E−17 |
| 2 | 206 | (8, 0) | 2.04 | 1.11E−02 | 0 | 5.89.E−18 |
| 3 | 236 | (8, 0) | 1.85 | 5.79E−04 | 0 | 4.20E−19 |
| 4 | 240 | (8, 0) | 1.73 | 1.92E−04 | 0 | 3.62E−19 |
| 5 | 244 | (8, 0) | 1.64 | 4.90E−05 | 0 | 2.14E−18 |
| 6 | 248 | (8, 0) | 1.58 | 5.00E−06 | 0 | 1.40E−17 |

TABLE 1-continued

Parameters for the first example of the most preferred embodiment.

| Layer index i | $K_{out,i}$ | $(p_i, r_i)$ | $V_{ave}/N_{in}$ | $\upsilon_i$ | $\delta_i$ | $\phi_i$ |
|---|---|---|---|---|---|---|
| 7 | 250 | (8, 0) | 1.52 | *1.72E−07 | 0 | 2.19E−18 |
| 8 | 252 | (8, 0) | 1.46 | *4.52E−09 | 0 | 3.63E−23 |
| 9 | 252 | (8, 0) | 1.41 | *9.18E−11 | 0 | 8.73E−19 |
| 10 | 254 | (8, 0) | 1.38 | *2.40E−12 | 0 | 3.65E−30 |
| 11 | 254 | (8, 0) | 1.33 | *1.70E−28 | 0 | 1.10E−19 |
| 12 | 256 | (8, 0) | 1.28 | *1.25E−23 | 0 | 2.14E−23 |
| 13 | 256 | (8, 0) | 1.25 | *4.66E−35 | 0 | 7.72E−44 |

Example 2. The second example is the same as the first example except here we use precoding with a 4-bit CRC with impulse response polynomial $g(x)=1+x+x^4$. The CRC checks on the entire data payload of the inner code and the CRC bits are inserted into the final layer (layer 13) of the inner code, as shown in the last entry of the second column of Table 2. The CRC makes it possible to mark some of the errors at the inner decoder output as erasures, which in turn increases the efficiency of the outer codes.

The simulation results for the third example are presented in Table 2. The sum $\Sigma_{i=1}^{m=13} \phi_i$ equals $3.08 \cdot 10^{-16}$, which shows that the FER for the concatenated code in this example satisfies the target FER $10^{-15}$. The concatenated code in this example has dimension $K=\Sigma_{i=1}^{13} K_{out,i} p_i=25,296$, block length $N=32,768$, and rate $R=K/N=0.772$. The Shannon limit on the minimum required SNR for achieving $R=0.772$ on the BI-AWGN channel is 3.686 dB; thus, the gap to Shannon limit for the concatenated code in this example is estimated as 1.814 dB.

This second example demonstrates that a CRC may narrow the gap to Shannon limit by helping mark some errors as erasures and enabling the outer decoder to recover from a larger number of errors left over by the PAC code. In general, a b-bit CRC will fail to detect a fraction $2^{-b}$ of the symbol errors at the output of the inner code. The length b of the CRC has to be chosen with care; a small b means less precoding overhead but will not be as effective as a larger b in detecting errors.

TABLE 2

Parameters for the second example of the most preferred embodiment.

| Layer index i | $K_{out,i}$ | $(p_i, r_i)$ | $V_{ave}/N_{in}$ | $\upsilon_i$ | $\delta_i$ | $\phi_i$ |
|---|---|---|---|---|---|---|
| 1 | 185 | (8, 0) | 2.36 | 5.15E−03 | 7.41E−02 | 5.12E−17 |
| 2 | 227 | (8, 0) | 2.04 | 7.05E−04 | 1.01E−02 | 3.39E−17 |
| 3 | 243 | (8, 0) | 1.85 | 4.70E−05 | 5.06E−04 | 5.88E−17 |
| 4 | 246 | (8, 0) | 1.73 | 5.00E−06 | 1.68E−04 | 2.87E−18 |
| 5 | 248 | (8, 0) | 1.64 | 2.00E−06 | 3.90E−05 | 3.12E−17 |
| 6 | 252 | (8, 0) | 1.58 | 0.00 | 2.00E−06 | 2.82E−19 |
| 7 | 251 | (8, 0) | 1.52 | *1.07E−08 | *1.61E−07 | 3.43E−18 |
| 8 | 252 | (8, 0) | 1.46 | *2.82E−10 | *4.24E−09 | 2.86E−21 |
| 9 | 254 | (8, 0) | 1.41 | *5.74E−12 | *8.60E−11 | 3.33E−17 |
| 10 | 254 | (8, 0) | 1.38 | *1.50E−13 | *2.25E−12 | 2.28E−20 |
| 11 | 255 | (8, 0) | 1.33 | *1.06E−19 | *1.60E−18 | 2.72E−17 |
| 12 | 256 | (8, 0) | 1.28 | *7.80E−25 | *1.17E−23 | 3.19E−21 |
| 13 | 256 | (4 + 4) | 1.25 | *2.91E−36 | *4.37E−35 | 1.19E−32 |

Example 3. The third example is the same as the first example except here we set $V_{max}=8 \cdot_{in}=1024$. The simulation results for the third example are presented in Table 3. The sum $\Sigma_{i=1}^{m=13} \phi_i$ equals $4.33 \cdot 10^{-16}$, which shows that the FER for the concatenated code in this example satisfies the target FER $10^{-15}$.

The concatenated code has dimension $K=\Sigma_{i=1}^{13} K_{out,i} p_i=24{,}536$, block length $N=32{,}768$, and rate $R=K/N=0.749$. The Shannon limit on the minimum required SNR for achieving $R=0.749$ on the BI-AWGN channel is 3.371 dB; thus, the gap to Shannon limit for the concatenated code in this example is estimated as 2.129 dB.

It is noteworthy that the code rate, gap to capacity, and average computation $V_{ave}/N_{in}$ in this example are all close to the corresponding quantities in the first example, despite having here a much tighter time-out limit $V_{max}$. The tighter computational time-out limit manifests itself in producing erasures as a result of decoder time-outs. Such time-outs are especially significant at higher layers where they become the dominant determinant of inner code performance. Note that in this example, simulations produced measured errors/erasures at all layers, so there was no need to use analytical bounds.

TABLE 3

Parameters for the third example of the most preferred embodiment.

| Layer index i | $K_{out,i}$ | $(p_i, r_i)$ | $V_{ave}/N_{in}$ | $v_i$ | $\delta_i$ | $\phi_i$ |
|---|---|---|---|---|---|---|
| 1  | 129 | (8, 0) | 2.28 | 7.09E−02 | 2.36E−02 | 6.38E−17 |
| 2  | 209 | (8, 0) | 1.99 | 7.64E−03 | 8.44E−03 | 9.41E−17 |
| 3  | 238 | (8, 0) | 1.83 | 1.27E−04 | 2.70E−03 | 3.75E−17 |
| 4  | 240 | (8, 0) | 1.72 | 1.34E−04 | 5.90E−04 | 1.15E−17 |
| 5  | 244 | (8, 0) | 1.64 | 3.86E−05 | 2.19E−04 | 8.66E−17 |
| 6  | 247 | (8, 0) | 1.58 | 5.00E−06 | 1.05E−04 | 7.21E−17 |
| 7  | 250 | (8, 0) | 1.52 | 0.00 | 3.60E−05 | 1.02E−18 |
| 8  | 251 | (8, 0) | 1.46 | 0.00 | 2.30E−05 | 5.43E−17 |
| 9  | 251 | (8, 0) | 1.41 | 0.00 | 1.00E−05 | 3.68E−19 |
| 10 | 252 | (8, 0) | 1.38 | 0.00 | 2.00E−06 | 2.82E−19 |
| 11 | 252 | (8, 0) | 1.33 | 0.00 | 4.00E−06 | 9.01E−18 |
| 12 | 252 | (8, 0) | 1.28 | 0.00 | 3.00E−06 | 2.82E−19 |
| 13 | 252 | (8, 0) | 1.25 | 0.00 | 3.00E−06 | 2.14E−18 |

Example 4. The fourth example is the same as the first example, except here we use the same 4-bit CRC as in the second example and set $V_{max}=8 \cdot N_{in}=1024$ as in the third example. The simulation results for the fourth example are presented in Table 4. The sum $\Sigma_{i=1}^{m=13} \phi_i$ equals $2.91 \cdot 10^{-16}$, which shows that the FER for the concatenated code in this example satisfies the target FER $10^{-15}$. The concatenated code in this example has dimension $K=\Sigma_{i=1}^{13} K_{out,i} p_i=25{,}056$, block length $N=32{,}768$, and rate $R=K/N=0.765$. The Shannon limit on the minimum required SNR for achieving $R=0.765$ on the BI-AWGN channel is 3.585 dB; thus, the gap to Shannon limit for the concatenated code in the example is estimated as 1.915 dB.

Compared to the first and third examples, we see a significant improvement in the gap to capacity, which is explained by the presence of precoding. Compared to the second example, there is a slight degradation in gap to capacity, which shows that using a tight time-out limit did not significantly degrade performance. We also observe that the time-out mechanism made itself felt in decoding the initial layers, while the CRC was effective in detecting errors at the final layers. So, the two methods complemented each other in generating erasures.

TABLE 4

Parameters for the fourth example of the most preferred embodiment.

| Layer index i | $K_{out,i}$ | $(p_i, r_i)$ | $V_{ave}/N_{in}$ | $v_i$ | $\delta_i$ | $\phi_i$ |
|---|---|---|---|---|---|---|
| 1  | 184 | (8, 0) | 2.27 | 3.09E−03 | 8.51E−02 | 4.73E−17 |
| 2  | 224 | (8, 0) | 1.99 | 2.67E−04 | 1.76E−02 | 2.61E−17 |
| 3  | 240 | (8, 0) | 1.83 | 1.53E−05 | 3.05E−03 | 5.73E−17 |

TABLE 4-continued

Parameters for the fourth example of the most preferred embodiment.

| Layer index i | $K_{out,i}$ | $(p_i, r_i)$ | $V_{ave}/N_{in}$ | $v_i$ | $\delta_i$ | $\phi_i$ |
|---|---|---|---|---|---|---|
| 4  | 245 | (8, 0) | 1.72 | 3.72E−06 | 7.40E−04 | 3.53E−17 |
| 5  | 247 | (8, 0) | 1.64 | 2.36E−06 | 2.33E−04 | 3.85E−17 |
| 6  | 249 | (8, 0) | 1.58 | 0.00 | 1.01E−04 | 4.34E−18 |
| 7  | 250 | (8, 0) | 1.52 | 0.00 | 4.40E−05 | 4.16E−18 |
| 8  | 251 | (8, 0) | 1.46 | 0.00 | 1.30E−05 | 1.77E−18 |
| 9  | 251 | (8, 0) | 1.41 | 0.00 | 1.30E−05 | 1.77E−18 |
| 10 | 251 | (8, 0) | 1.38 | 0.00 | 9.00E−06 | 1.95E−19 |
| 11 | 252 | (8, 0) | 1.33 | 0.00 | 4.00E−06 | 9.01E−18 |
| 12 | 252 | (8, 0) | 1.28 | 0.00 | 2.00E−06 | 2.82E−19 |
| 13 | 252 | (4, 4) | 1.25 | 0.00 | 4.00E−06 | 9.01E−18 |

Additional Implementation Details

We have given four examples to illustrate the most preferred embodiment of the present principles. The following describes some alternative embodiments of the present principles that are not covered by these examples.

The most preferred embodiment was described with respect to a sequential decoder as the inner decoder for PAC codes. Sequential decoders are depth-first search algorithms originally designed for decoding of convolutional codes. The person skilled in the art will recognize that it is also possible to decode the inner PAC codes by adapting various other decoding methods originally designed for convolutional coding, such as breadth-first search algorithms, including Viterbi decoding or Viterbi decoding with a list of candidate paths per state or beam search algorithms similar to successive cancellation list decoding for polar codes.

In the most preferred embodiment of the present principles, time-out rules have been enforced by a time-out limit $V_{max}$. An alternative is to switch from the ith layer inner decoding to the decoding of the ith outer code as soon as the number of ith layer inner decoders that have completed their decoding tasks exceed a certain threshold.

In the second and fourth examples above, a single precoding block was placed in the final layer of the LPAC code. Such a precoding block provides a check on all layers; however, the sequential decoder for the inner code has to complete its search before it can utilize the precoding block for error detection. An alternative is to use several precoding blocks that are distributed to several layers to speed up error detection.

The most preferred embodiment was described with respect to a bounded distance decoder for the outer Reed-Solomon codes. In alternative implementations, the bounded distance decoder may be replaced by a more powerful decoder, such as a Generalized Minimum Distance (GMD) decoder, which is a type of decoder that can utilize soft information provided by the inner decoder.

The present principles were presented with respect to inner codes over the binary alphabet $\mathbb{F}_2=\{0,1\}$. The person skilled in the art will have no difficulty in generalizing the present principles to the case of inner codes over non-binary alphabets.

The present principles were presented with respect to non-systematic encoding of the inner LPAC codes. It is possible to implement the present principles with a systematic encoding of the inner LPAC codes.

The present principles were presented with respect to the case where the inner LPAC code has a block length $N_{in}$ that is a power of two. An alternative is to use PAC code shortening and puncturing methods to adjust the block length $N_{in}$ to any desired value by using the methods as disclosed in "E. Arikan, U.S. patent application Ser. No. 16/700,972, 2 Dec. 2019", incorporated herein by reference.

This completes the description of various embodiments of the present principles. We now turn to some examples of communication systems within which the present principles may be used. The present principles can be used in any type of communication or storage system where protection of data with high reliability is required. Examples of such systems include wireless and wireline communication systems (including satellite and optical communications) and computer memory or cloud storage systems.

Figure 4:
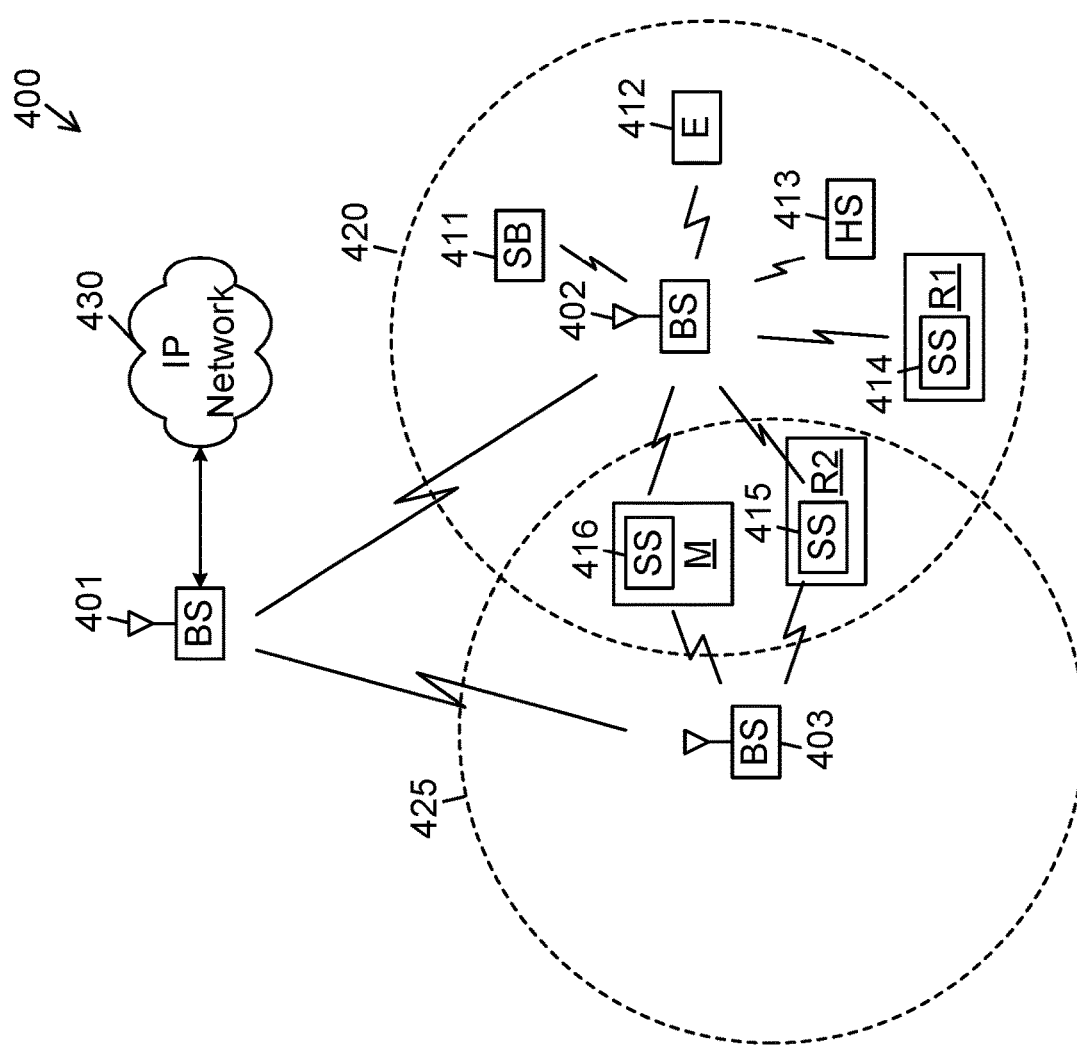
FIG. 4 illustrates an example wireless network within which encoding and decoding of data using concatenated polarization adjusted convolutional codes may be implemented according to this disclosure.

FIG. 4 illustrates an example wireless network within which encoding and decoding of data using concatenated polarization adjusted convolutional codes may be implemented according to this disclosure. The embodiment of the wireless network 400 shown in FIG. 4 is for illustration only. Other embodiments of the wireless network 400 could be used without departing from the scope of this disclosure. The wireless network 400 includes an eNodeB (eNB) 401, an eNB 402, and an eNB 403. The eNB 401 communicates with the eNB 402 and the eNB 403. The eNB 401 also communicates with at least one Internet Protocol (IP) network 430, such as the Internet, a proprietary IP network, or other data network.

Depending on the network type, other well-known terms may be used instead of "eNodeB" or "eNB," such as "base station", "BS", or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 402 provides wireless broadband access to the network 430 for a first plurality of user equipments (UEs) within a coverage area 420 of the eNB 402. The first plurality of UEs includes a UE 411, which may be located in a small business (SB); a UE 412, which may be located in an enterprise (E); a UE 413, which may be located in a WiFi hotspot (HS); a UE 414, which may be located in a first residence (R1); a UE 415, which may be located in a second residence (R2); and a UE 416, which may be a mobile device (M) like a cell phone, a wireless laptop, a wireless personal digital assistant (PDA), tablet, or the like. The eNB 403 provides wireless broadband access to the network 430 for a second plurality of UEs within a coverage area 425 of the eNB 403. The second plurality of UEs includes the UE 415 and the UE 416. In some embodiments, one or more of the eNBs 401-403 may communicate with each other and with the UEs 411-416 using 3G, 4G or 5G, long-term evolution (LTE), LTE-A, WiMAX, or other advanced wireless communication techniques.

Dotted lines show the approximate extents of the coverage areas 420 and 425, which are shown as approximately circular for the purposes of illustration and explanation only. It should be clearly understood that the coverage areas associated with eNBs, such as the coverage areas 420 and 425, may have other shapes, including irregular shapes, depending upon the configuration of the eNBs and variations in the radio environment associated with natural and man-made obstructions.

As described in more detail below, one or more of eNB 401, eNB 402 and eNB 403 include 2D antenna arrays that can be used in conjunction with embodiments of the present disclosure. In some embodiments, one or more of eNB 401, eNB 402 and eNB 403 support the codebook design and structure for systems having 2D antenna arrays.

Although FIG. 4 illustrates one example of a wireless network 400, various changes may be made to FIG. 4. For example, the wireless network 400 could include any number of eNBs and any number of UEs in any suitable arrangement. Also, the eNB 401 could communicate directly with any number of UEs and provide those UEs with wireless broadband access to the network 430. Similarly, each eNB 402-403 could communicate directly with the network 430 and provide UEs with direct wireless broadband access to the network 430. Further, the eNB 401, 402, and/or 403 could provide access to other or additional external networks, such as external telephone networks or other types of data networks.

The example channel decoding systems depicted in the figures and described above may be implemented in an eNB (such as eNB 402) and/or a UE (such as UE 416), as described in further detail below.

Figure 5A:
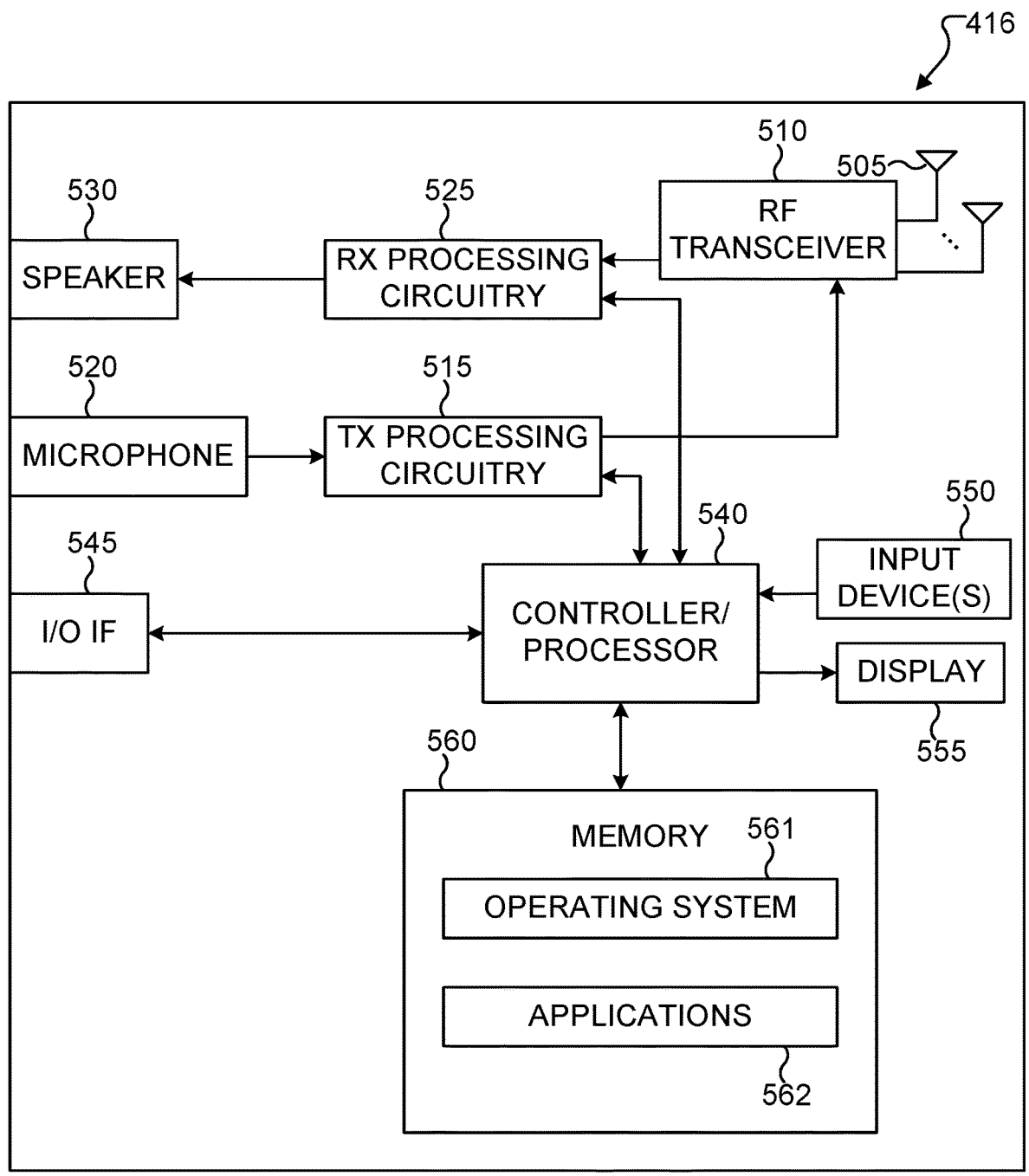
FIG. 5A illustrates an example user equipment network within which encoding and decoding of data using concatenated polarization adjusted convolutional codes may be implemented according to this disclosure.

FIG. 5A illustrates an example user equipment network within which encoding and decoding of data using concatenated polarization adjusted convolutional codes may be implemented according to this disclosure. The embodiment of the UE 416 illustrated in FIG. 5A is for illustration only, and the UEs 411-416 of FIG. 4 could have the same or similar configuration. However, UEs come in a wide variety of configurations, and FIG. 5A does not limit the scope of this disclosure to any particular implementation of a UE.

The UE 416 includes an antenna 505, a radio frequency (RF) transceiver 510, transmit (TX) processing circuitry 515 (which may include the concatenated encoder 102 in FIG. 1), a microphone 520, and receive (RX) processing circuitry 525 (which may include the concatenated decoder 106 in FIG. 1). The UE 416 also includes a speaker 530, a main processor 540, an input/output (I/O) interface (IF) 545, a keypad 550, a display 555, and a memory 560. The memory 560 includes a basic operating system (OS) program 561 and one or more applications 562. Either the OS program 561, one of the applications 562, or some combination thereof may implement programming for employing error correction coding as described in the various embodiments of FIGS. 1 through 3.

The RF transceiver 510 receives, from the antenna 505, an incoming RF signal transmitted by an eNB of the network 400. The RF transceiver 510 may down-convert the incoming RF signal to generate an intermediate frequency (IF) or baseband signal which would be sent to the receiver (RX) processing circuitry 525. The RX processing circuitry 525 transmits the processed signal to the speaker 530 (such as for voice data) or to the main processor 540 for further processing (such as for web browsing data).

The transmit (TX) processing circuitry 515 receives, as at least some input data for the source data block, analog or digital voice data from the microphone 520 or other outgoing baseband data (such as web data, e-mail, or interactive video game data) from the main processor 540. The TX processing circuitry 515 implements encoding. The RF transceiver 510 receives the outgoing processed baseband or IF signal from the TX processing circuitry 515 and up-converts the baseband or IF signal to an RF signal that is transmitted via the antenna 505.

The main processor 540 can include one or more processors or other processing devices and execute the basic OS program 561 stored in the memory 560 in order to control the overall operation of the UE 416. For example, the main processor 540 could control the reception of forward channel signals and the transmission of reverse channel signals by the RF transceiver 510, the RX processing circuitry 525, and the TX processing circuitry 515 in accordance with well-known principles. In some embodiments, the main processor 540 includes at least one programmable microprocessor or microcontroller, while in other embodiments the main processor includes dedicated circuitry (e.g., for systematic and/or non-systematic encoding or decoding processes, shortening processes, data mapping, etc.) as well as (optionally) programmable logic or processing circuits.

The main processor 540 is also capable of executing other processes and programs resident in the memory 560, such as operations for channel quality measurement and reporting for systems having 2D antenna arrays. The main processor 540 can move data and/or instructions into or out of the memory 560 as required by an executing process. In some embodiments, the main processor 540 is configured to execute the applications 562 based on the OS program 561 or in response to signals received from eNBs or an operator. The main processor 540 is also coupled to the I/O interface 545, which provides the UE 416 with the ability to connect to other devices such as laptop computers and handheld computers. The I/O interface 545 is the communication path between these accessories and the main controller 540.

The main processor 540 is also coupled to the keypad 550 (which may simply be a single button or may be an array or other set of buttons) and the display unit 555. The operator of the UE 416 can use the keypad 550 to enter data into the UE 416. The display 555 may be a touch screen display or other display capable of rendering text and/or at least limited graphics, such as from web sites, and receiving touch inputs by a user in accordance with known practices.

The memory 560 is coupled to the main processor 540, and at least a part of the memory 560 could include a random access memory (RAM), and another part of the memory 560 could include a Flash memory or other read-only memory (ROM).

Although FIG. 5A illustrates one example of UE 416, various changes may be made to FIG. 5A. For example, various components in FIG. 5A could be combined, further subdivided, or omitted and additional components could be added according to particular needs. As a particular example, the main processor 540 could be divided into multiple processors, such as one or more central processing units (CPUs), one or more application specific integrated circuits (ASICs), one or more field programmable gate arrays (FPGAs), and one or more graphics processing units (GPUs). Also, while FIG. 5A illustrates the UE 416 configured as a mobile telephone or smartphone, UEs could be configured to operate as other types of mobile or stationary devices.

Figure 5B:
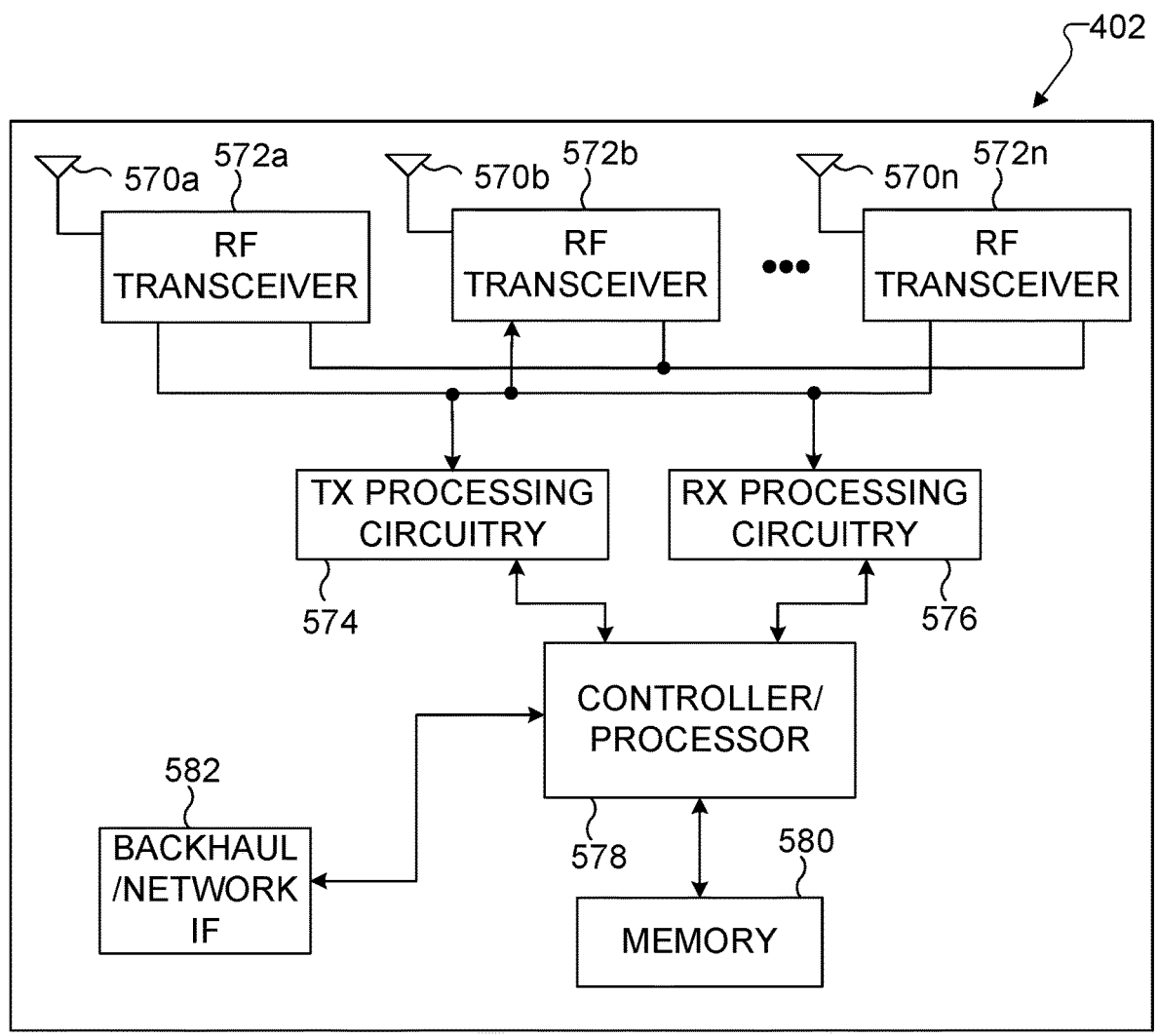
FIG. 5B illustrates an example enhanced NodeB (eNB) network within which encoding and decoding of data using concatenated polarization adjusted convolutional codes may be implemented according to this disclosure.

FIG. 5B illustrates an example enhanced NodeB (eNB) network within which encoding and decoding of data using concatenated polarization adjusted convolutional codes may be implemented according to this disclosure. The embodiment of the eNB 402 shown in FIG. 5B is for illustration only, and other eNBs of FIG. 4 could have the same or similar configuration. However, eNBs come in a wide variety of configurations, and FIG. 5B does not limit the scope of this disclosure to any particular implementation of an eNB. It is noted that eNB 401 and eNB 403 can include the same or similar structure as eNB 402.

As shown in FIG. 5B, the eNB 402 includes multiple antennas 570a-570n, multiple RF transceivers 572a-572n, transmit (TX) processing circuitry 574, and receive (Rx) processing circuitry 576. In certain embodiments, one or more of the multiple antennas 570a-570n include 2D antenna arrays. The eNB 402 also includes a controller/processor 578, a memory 580, and a backhaul or network interface 582.

The RF transceivers 572a-572n receive, from the antennas 570a-570n, incoming RF signals, such as signals transmitted by UEs or other eNBs. The RF transceivers 572a-572n down-convert the incoming RF signals to generate IF or baseband signals. The IF or baseband signals are sent to the Rx processing circuitry 576, which generates processed signals by filtering, decoding, and/or digitizing the baseband or IF signals. The Rx processing circuitry 576 transmits the processed signals to the controller/processor 578 for further processing.

The TX processing circuitry 574 receives, at least some input data from the concatenated encoder 102. The TX processing circuitry 574 implements circuits to encode, multiplex, and/or digitize the outgoing baseband data to generate processed signals. The RF transceivers 572a-572n receive the outgoing processed signals from the TX processing circuitry 574 and up-converts the baseband or IF signals to RF signals that are transmitted via the antennas 570a-570n.

The controller/processor 578 can include one or more processors or other processing devices that control the overall operation of the eNB 402. For example, the controller/processor 578 could control the reception of forward channel signals and the transmission of reverse channel signals by the RF transceivers 572a-572n, the Rx processing circuitry 576, and the TX processing circuitry 574 in accordance with well-known principles. The controller/processor 578 could support additional functions as well, such as more advanced wireless communication functions. Any of a wide variety of other functions could be supported in the eNB 402 by the controller/processor 578. In some embodiments, the controller/processor 578 includes at least one microprocessor or microcontroller, while in other embodiments the main processor includes dedicated circuitry (e.g., for encoding and decoding processes, code puncturing and/or shortening processes, data mapping, etc.) as well as (optionally) programmable logic or processing circuits.

The controller/processor 578 is also capable of executing programs and other processes resident in the memory 580, such as a basic OS. The controller/processor 578 is also capable of supporting channel quality measurement and reporting for systems having 2D antenna arrays. In some embodiments, the controller/processor 578 supports communications between entities. The controller/processor 578 can move data and/or instructions into or out of the memory 580 as required by an executing process.

The controller/processor 578 is also coupled to the backhaul or network interface 582. The backhaul or network interface 582 allows the eNB 402 to communicate with other devices or systems over a backhaul connection or over a network. The interface 582 could support communications over any suitable wired or wireless connection(s). For example, when the eNB 402 is implemented as part of a cellular communication system (such as one supporting 3G, 4G, 5G, LTE, or LTE-A), the interface 582 could allow the eNB 402 to communicate with other eNBs over a wired or wireless backhaul connection. When the eNB 402 is implemented as an access point, the interface 582 could allow the eNB 402 to communicate over a wired or wireless local area network or over a wired or wireless connection to a larger network (such as the Internet). The interface 582 includes any suitable structure supporting communications over a wired or wireless connection, such as an Ethernet or RF transceiver.

The memory 580 is coupled to the controller/processor 578. Part of the memory 580 could include a RAM, and another part of the memory 580 could include a Flash memory or other ROM. In certain embodiments, a plurality of instructions is stored in memory. The instructions are configured to cause the controller/processor 578 to perform the systematic and/or non-systematic encoding or decoding processes, shortening processes, data mapping, etc.

Although FIG. 5B illustrates one example of an eNB 402, various changes may be made to FIG. 5B. For example, the eNB 402 could include any number of each component shown. As a particular example, an access point could include a number of interfaces 582, and the controller/processor 578 could support routing functions to route data between different network addresses. As another particular example, while shown as including a single instance of TX processing circuitry 574 and a single instance of Rx processing circuitry 576, the eNB 402 could include multiple instances of each (such as one per RF transceiver).

While particular embodiments of METHODS AND APPARATUS FOR ENCODING AND DECODING OF DATA USING CONCATENATED POLARIZATION ADJUSTED CONVOLUTIONAL CODES are herein described in detail and depicted in the drawings, it is to be understood that the subject matter which is encompassed by the present disclosure is limited only by the claims. Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A concatenated encoder apparatus for use in a communication system, the concatenated encoder comprising:
    an outer encoder configured to receive a concatenated encoder input block d, split the concatenated encoder input block d into an outer code input array a, and encode the outer code input array a in accordance with a plurality of outer codes to generate an outer code output array b; and
    an inner encoder configured to generate, from the outer code output array b, a concatenated code output array x in accordance with a layered polarization adjusted convolutional (LPAC) code, and send the concatenated code output array x to a channel,
    wherein the plurality of outer codes comprises at least two outer codes, wherein the LPAC code comprises at least two layers.

2. The concatenated encoder apparatus of claim 1, wherein the inner encoder is further configured to compute a precoding array c from the outer code output array b and insert the precoding array c into the data container array v.

3. The concatenated encoder apparatus of claim 1, wherein the LPAC code comprises a data index set $\mathcal{A}$ and a partition of the data index set $\mathcal{A}$ into a plurality of layer index sets ($\mathcal{A}_1, \mathcal{A}_2, \ldots, \mathcal{A}_L$), wherein the plurality of layer index sets ($\mathcal{A}_1, \mathcal{A}_2, \ldots, \mathcal{A}_L$) are chosen in accordance with a score function, wherein the score function is one of a Hamming score function, a reliability score function, a decoding order score function, or a combination thereof.

4. A concatenated decoder apparatus for use in a communication system, the concatenated decoder apparatus comprising:
    a layer counter configured to count a number of layers;
    an inner decoder configured to carry out an ith layer inner decoding operation in accordance with a layered polarization adjusted convolutional (LPAC) code to generate an ith inner decoder decision $\hat{b}_i$ from a concatenated decoder input array y and an (i−1)th cumulative decision feedback ($\hat{b}_1, \hat{b}_2, \ldots, \hat{b}_{i-1}$);
    an outer decoder configured to carry out an ith layer outer decoding operation to generate from the ith inner decoder decision $\hat{b}_i$ an ith outer decoder decision $\hat{a}_i$; and
    a reencoder configured to carry out an ith layer reencoding operation to generate an ith decision feedback $\hat{b}_i$ from the ith outer decoder decision $\hat{a}_i$,
    wherein the number of layers is equal to an integer m, wherein the integer m is greater than one, and wherein the outer decoder is further configured to generate a concatenated decoder output block $\hat{d}$ from outer decoder decisions ($\hat{a}_1, \hat{a}_2, \ldots, \hat{a}_m$) and send the concatenated decoder output block $\hat{d}$ to a destination.

5. The concatenated decoder apparatus of claim 4, wherein at least one of the ith layer inner decoding operations comprises employing a sequential decoder for decoding the LPAC code.

6. The concatenated decoder apparatus of claim 5, wherein the sequential decoder is equipped with a computational time-out limit.

7. A concatenated encoder method for use in a communication system, the concatenated encoder method:
    at an outer encoder, receiving a concatenated encoder input block d, splitting the concatenated encoder input block d into an outer code input array a, and encoding the outer code input array a in accordance with a plurality of outer codes to generate an outer code output array b; and
    at an inner encoder, generating, from the outer code output array b, a concatenated code output array x in accordance with a layered polarization adjusted convolutional (LPAC) code, and sending the concatenated code output array x to a channel,
    wherein the plurality of outer codes comprises at least two outer codes, wherein the LPAC code comprises at least two layers.

8. The concatenated encoder method of claim 7, further comprising:
at the inner encoder, computing a precoding array c from the outer code output array b and inserting the precoding array c into the data container array v.

9. The concatenated encoder method of claim 7, wherein the LPAC code comprises a data index set $\mathcal{A}$ and a partition of the data index set $\mathcal{A}$ into a plurality of layer index sets $(\mathcal{A}_1, \mathcal{A}_2, \ldots, \mathcal{A}_L)$, wherein the plurality of layer index sets $(\mathcal{A}_1, \mathcal{A}_2, \ldots, \mathcal{A}_L)$ are chosen in accordance with a score function, wherein the score function is one of a Hamming score function, a reliability score function, a decoding order score function, or a combination thereof.

10. A concatenated decoder method for use in a communication system, the concatenated decoder method comprising:
counting a number of layers;
at an inner decoder, carrying out an ith layer inner decoding operation in accordance with a layered polarization adjusted convolutional (LPAC) code to generate an ith inner decoder decision $\tilde{b}_i$ from a concatenated decoder input array y and an (i−1)th cumulative decision feedback $(\hat{b}_1, \hat{b}_2, \ldots, \hat{b}_{i-1})$;
at an outer decoder, carrying out an ith layer outer decoding operation to generate from the ith inner decoder decision $\tilde{b}_i$ an ith outer decoder decision $\hat{a}_i$; and
at a reencoder, carrying out an ith layer reencoding operation to generate an ith decision feedback $\hat{b}_i$ from the ith outer decoder decision $\hat{a}_i$,
wherein the number of layers is equal to an integer m, wherein the integer m is greater than one, the concatenated decoder method further comprising, at the outer decoder, generating a concatenated decoder output block $\hat{d}$ from outer decoder decisions $(\hat{a}_1, \hat{a}_2, \ldots, \hat{a}_m)$ and sending the concatenated decoder output block $\hat{d}$ to a destination.

11. The concatenated decoder method of claim 10, wherein at least one of the ith layer inner decoding operations comprises employing a sequential decoder for decoding the LPAC code.

12. The concatenated decoder method of claim 11, wherein the sequential decoder is equipped with a computational time-out limit.

* * * * *